(12) United States Patent
Kim et al.

(10) Patent No.: US 11,616,051 B2
(45) Date of Patent: Mar. 28, 2023

(54) SEMICONDUCTOR PACKAGE DEVICE

(71) Applicant: Samsung Electronics Co., Ltd., Suwon-si (KR)

(72) Inventors: Dongkyu Kim, Anyang-si (KR); Seokhyun Lee, Hwaseong-si (KR); Yeonho Jang, Cheonan-si (KR); Jaegwon Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 45 days.

(21) Appl. No.: 17/239,956

(22) Filed: Apr. 26, 2021

(65) Prior Publication Data
US 2022/0084993 A1     Mar. 17, 2022

(30) Foreign Application Priority Data

Sep. 16, 2020  (KR) ................. 10-2020-0119000

(51) Int. Cl.
*H01L 25/10*  (2006.01)
*H01L 23/00*  (2006.01)
(Continued)

(52) U.S. Cl.
CPC ........ *H01L 25/105* (2013.01); *H01L 21/4853* (2013.01); *H01L 21/4857* (2013.01);
(Continued)

(58) Field of Classification Search
CPC ............... H01L 25/105; H01L 21/4853; H01L 21/4857; H01L 21/563; H01L 21/565;
(Continued)

(56) References Cited

U.S. PATENT DOCUMENTS 6,107,685 A  8/2000 Nishiyama
6,607,938 B2  8/2003 Kwon et al.
(Continued)

FOREIGN PATENT DOCUMENTS

KR  100394808 B1  8/2003
KR  101236798 B1  2/2013

*Primary Examiner* — Kyoung Lee
*Assistant Examiner* — Christina A Sylvia
(74) *Attorney, Agent, or Firm* — Muir Patent Law, PLLC

(57) ABSTRACT

A semiconductor package device includes a first semiconductor package, a second semiconductor package, and first connection terminals between the first and second semiconductor packages. The first semiconductor package includes a lower redistribution substrate, a semiconductor chip, and an upper redistribution substrate vertically spaced apart from the lower redistribution substrate across the semiconductor chip. The upper redistribution substrate includes a dielectric layer, redistribution patterns vertically stacked in the dielectric layer and each including line and via parts, and bonding pads on uppermost redistribution patterns. The bonding pads are exposed from the dielectric layer and in contact with the first connection terminals. A diameter of each bonding pad decreases in a first direction from a central portion at a top surface of the upper redistribution substrate to an outer portion at the top surface thereof. A thickness of each bonding pad increases in the first direction.

20 Claims, 19 Drawing Sheets

(51) Int. Cl.
*H01L 23/31* (2006.01)
*H01L 23/538* (2006.01)
*H01L 21/683* (2006.01)
*H01L 21/48* (2006.01)
*H01L 21/56* (2006.01)
*H01L 25/00* (2006.01)

(52) U.S. Cl.
CPC .......... *H01L 21/563* (2013.01); *H01L 21/565* (2013.01); *H01L 21/568* (2013.01); *H01L 21/6835* (2013.01); *H01L 23/3128* (2013.01); *H01L 23/3135* (2013.01); *H01L 23/5383* (2013.01); *H01L 23/5386* (2013.01); *H01L 23/5389* (2013.01); *H01L 23/562* (2013.01); *H01L 24/19* (2013.01); *H01L 24/20* (2013.01); *H01L 24/48* (2013.01); *H01L 25/50* (2013.01); H01L 2221/68372 (2013.01); H01L 2224/214 (2013.01); H01L 2224/215 (2013.01); H01L 2224/48227 (2013.01); H01L 2225/1035 (2013.01); H01L 2225/1041 (2013.01); H01L 2225/1058 (2013.01); H01L 2924/01028 (2013.01); H01L 2924/01029 (2013.01); H01L 2924/01079 (2013.01); H01L 2924/3511 (2013.01)

(58) Field of Classification Search
CPC ............... H01L 21/568; H01L 21/6835; H01L 23/3128; H01L 23/3135; H01L 23/5383; H01L 23/5386; H01L 23/5389; H01L 23/562; H01L 24/19; H01L 24/20; H01L 24/48; H01L 25/50; H01L 2221/68372; H01L 2224/214; H01L 2224/215; H01L 2224/48227; H01L 2225/1035; H01L 2225/1041; H01L 2225/1058; H01L 2924/01028; H01L 2924/01029; H01L 2924/01079; H01L 2924/3511; H01L 23/49822; H01L 2224/04105; H01L 2224/12105; H01L 2225/1023; H01L 23/49816; H01L 23/49838; H01L 2221/68345; H01L 2221/68359; H01L 2225/1082; H01L 23/481; H01L 23/485; H01L 23/49827; H01L 23/50; H01L 23/525; H01L 24/06

See application file for complete search history.

(56) References Cited

U.S. PATENT DOCUMENTS

| | | | |
|---|---|---|---|
| 9,478,521 | B2 | 10/2016 | Chen et al. |
| 9,515,039 | B2 | 12/2016 | Lai et al. |
| 9,911,718 | B2 | 3/2018 | Prabhu et al. |
| 10,032,738 | B2 * | 7/2018 | Park .................... H01L 21/4853 |
| 10,535,644 | B1 | 1/2020 | Kuo et al. |
| 10,541,201 | B2 | 1/2020 | Lee et al. |
| 10,923,447 | B2 * | 2/2021 | Wirz ...................... H01L 24/06 |
| 2007/0007665 | A1 * | 1/2007 | Clevenger ............... H01L 23/13 257/E21.511 |
| 2016/0181196 | A1 * | 6/2016 | Lee ........................ H01L 23/525 257/773 |
| 2016/0322323 | A1 * | 11/2016 | Lai .......................... H01L 24/14 |
| 2017/0301637 | A1 * | 10/2017 | Huang .................... H01L 24/03 |
| 2019/0103379 | A1 * | 4/2019 | Yu ........................... H01L 24/06 |
| 2019/0341360 | A1 | 11/2019 | Yu et al. |

* cited by examiner

SEMICONDUCTOR PACKAGE DEVICE

CROSS-REFERENCE TO RELATED APPLICATION

This U.S. nonprovisional application claims priority under 35 U.S.C § 119 to Korean Patent Application No. 10-2020-0119000 filed on Sep. 16, 2020 in the Korean Intellectual Property Office, the disclosure of which is hereby incorporated by reference in its entirety.

BACKGROUND

The present inventive concepts relate to a semiconductor package device.

A semiconductor package is provided to implement an integrated circuit chip to qualify for use in electronic products. A semiconductor package includes a semiconductor chip which is mounted on a printed circuit board. Bonding wires or bumps are used to electrically connect the semiconductor chip to the printed circuit board within the semiconductor package. With the development of electronic industry, various studies have been conducted to improve reliability and durability of semiconductor packages.

SUMMARY

Some example embodiments of the present inventive concepts provide a semiconductor package device with increased reliability.

According to some example embodiments of the present inventive concepts, a semiconductor package device may include a first semiconductor package, a second semiconductor package on the first semiconductor package, and a plurality of first connection terminals between the first semiconductor package and the second semiconductor package. The first semiconductor package may include a lower redistribution substrate, a semiconductor chip on the lower redistribution substrate, and an upper redistribution substrate vertically spaced apart from the lower redistribution substrate across the semiconductor chip. The upper redistribution substrate may include a dielectric layer, a plurality of redistribution patterns which are vertically stacked in the dielectric layer and each of which includes a line part and a via part, and a plurality of bonding pads on uppermost ones of the redistribution patterns. The bonding pads may be exposed from the dielectric layer and in contact with the first connection terminals. A diameter of each of the bonding pads may decrease in a first direction from a central portion at a top surface of the upper redistribution substrate to an outer portion at the top surface of the upper redistribution substrate. A thickness of each of the bonding pads may increase in the first direction.

According to some example embodiments of the present inventive concepts, a semiconductor package device may comprise a first semiconductor package, a second semiconductor package on the first semiconductor package, and a plurality of connection terminals between the first semiconductor package and the second semiconductor package. The first semiconductor package may include a lower redistribution substrate, a first semiconductor chip on the lower redistribution substrate, and an upper redistribution substrate vertically spaced apart from the lower redistribution substrate across the first semiconductor chip. The upper redistribution substrate may include a dielectric layer, a plurality of redistribution patterns which are vertically stacked in the dielectric layer and each of which includes a line part and a via part, and a plurality of bonding pads on uppermost ones of the redistribution patterns. The bonding pads may be exposed from the dielectric layer and in contact with the connection terminals. A spacing distance between a top surface of the upper redistribution substrate and a bottom surface of the second semiconductor package may increase in a direction from a central portion at the top surface of the upper redistribution substrate to an outer portion at the top surface of the upper redistribution substrate. A level difference between a bottom surface of a first bonding pad, among the bonding pads, on the outer portion at the top surface of the upper redistribution substrate and a bottom surface of a second bonding pad, among the bonding pads, on the central portion at the top surface of the upper redistribution substrate may be greater than a level difference between a top surface of the first bonding pad and a top surface of the second bonding pad.

According to some example embodiments of the present inventive concepts, a semiconductor package device may comprise a first semiconductor package, a second semiconductor package on the first semiconductor package, and a plurality of first connection terminals between the first semiconductor package and the second semiconductor package. The first semiconductor package may include a lower redistribution substrate, a semiconductor chip on the lower redistribution substrate, a plurality of second connection terminals between the lower redistribution substrate and the semiconductor chip, a plurality of conductive pillars on the lower redistribution substrate and spaced apart from a lateral surface of the semiconductor chip, an under-fill layer that covers the second connection terminals, and an upper redistribution substrate vertically spaced apart from the lower redistribution substrate across the semiconductor chip. The upper redistribution substrate may include a dielectric layer, a plurality of redistribution patterns which are vertically stacked in the dielectric layer and each of which includes a line part and a via part, and a plurality of bonding pads on uppermost ones of the redistribution patterns. The bonding pads may be exposed from the dielectric layer and in contact with the first connection terminals. A diameter of each of the bonding pads may decrease in a first direction from a central portion at the top surface of the upper redistribution substrate to an outer portion at the top surface of the upper redistribution substrate. A thickness of each of the bonding pads may increase in the first direction.

DETAILED DESCRIPTION OF EMBODIMENTS

Some example embodiments of the present inventive concepts will now be described in detail with reference to the accompanying drawings to aid in clearly explaining the present inventive concepts.

Figure 1A:
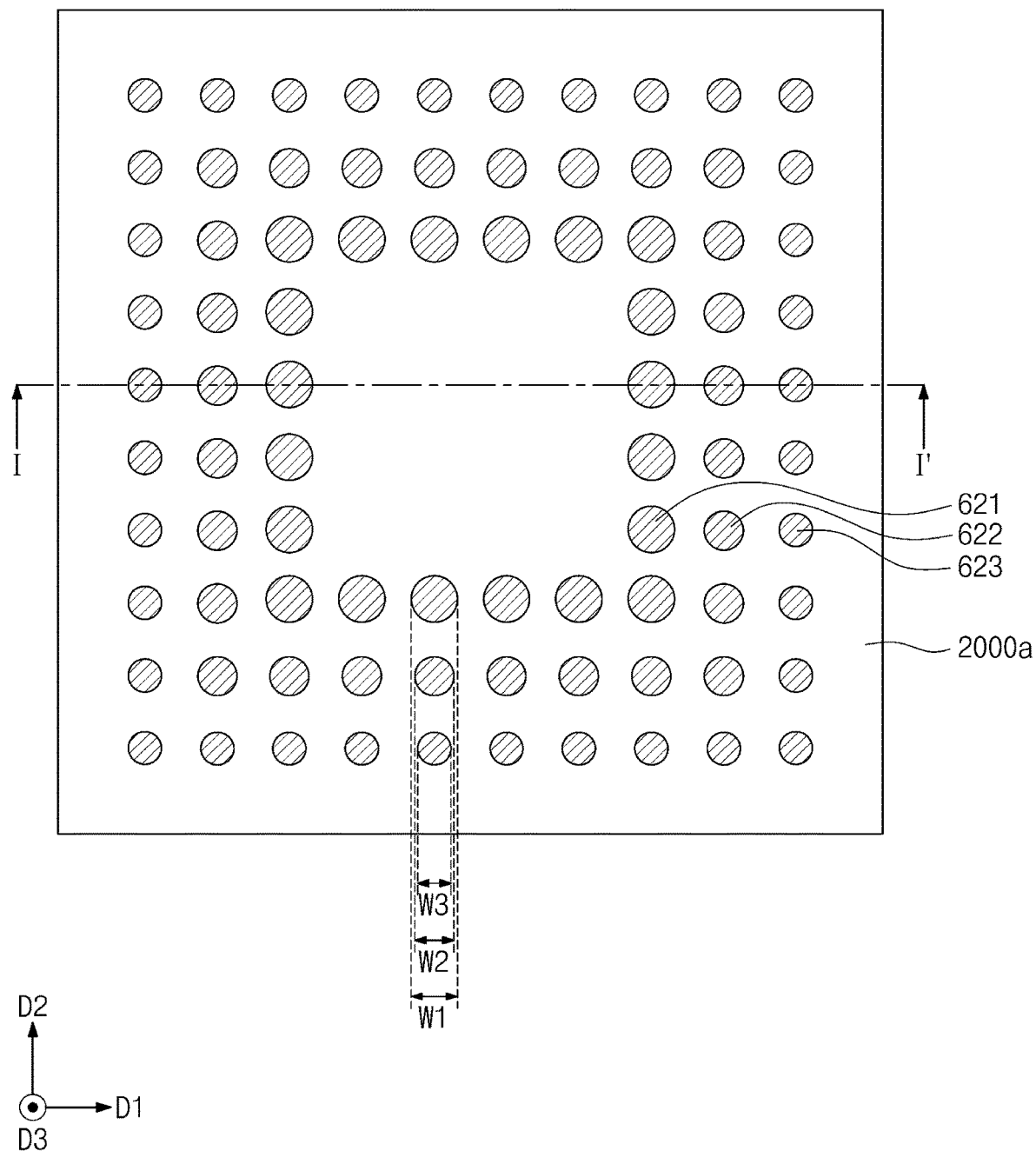
FIG. 1A illustrates a plan view showing a semiconductor package device according to some example embodiments of the present inventive concepts.
Figure 1B:
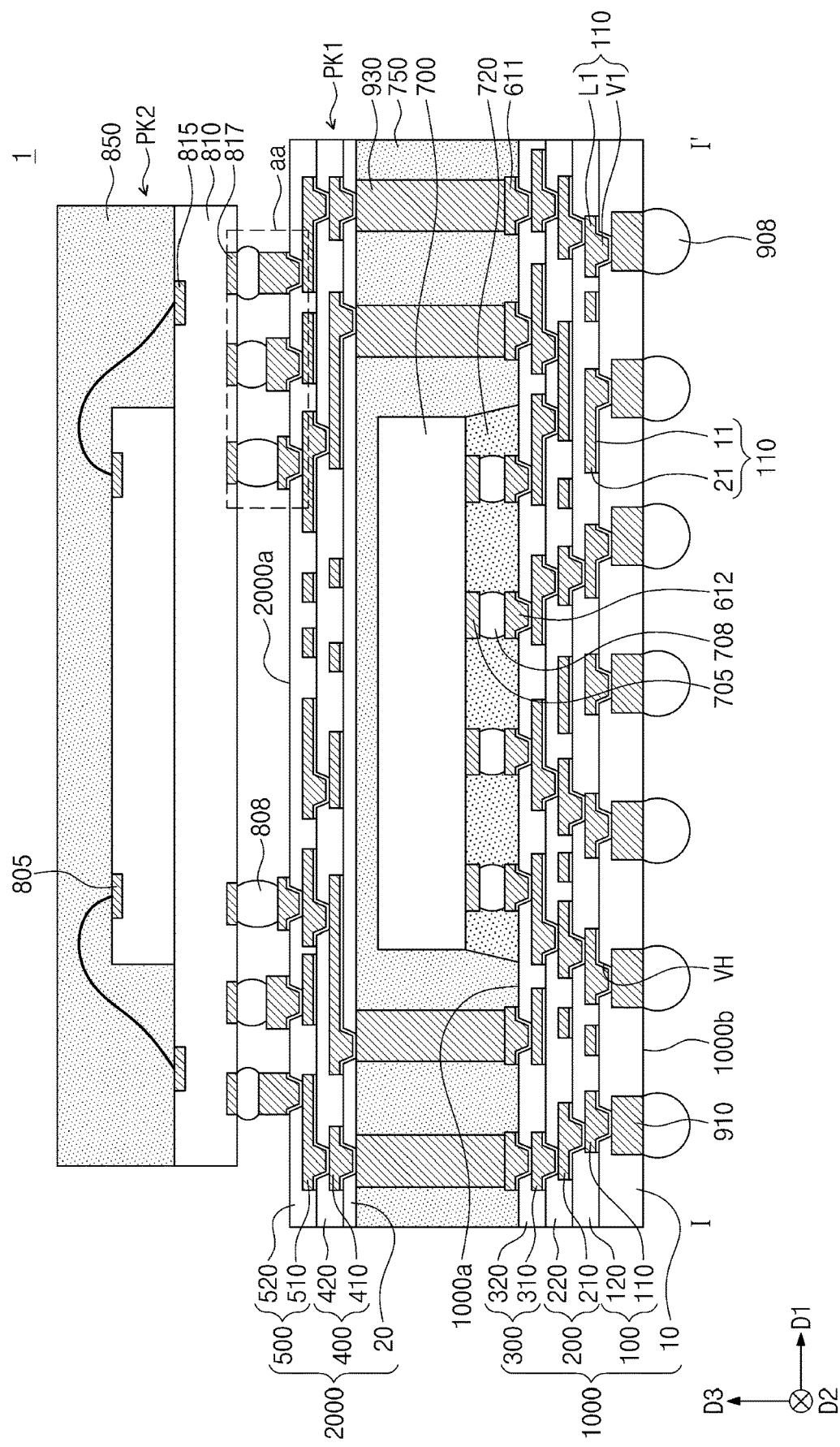
FIG. 1B illustrates a cross-sectional view taken along line I-I' of FIG. 1A.
Figure 1C:
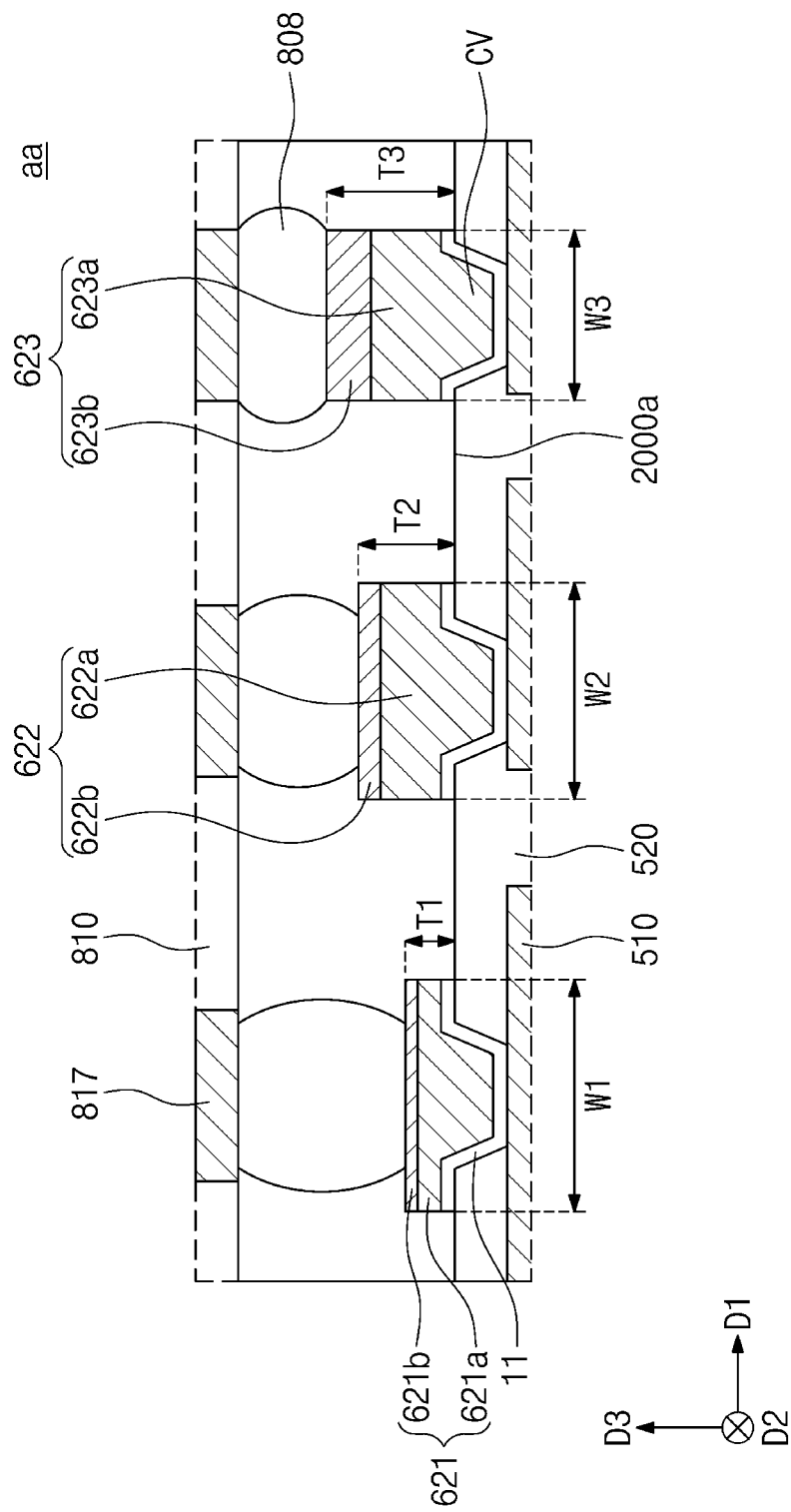
FIG. 1C illustrates an enlarged view showing section aa of FIG. 1B.

FIG. 1A illustrates a plan view showing a semiconductor package device 1 according to some example embodiments of the present inventive concepts. FIG. 1B illustrates a cross-sectional view taken along line I-I' of FIG. 1A. FIG. 1C illustrates an enlarged view showing section aa of FIG. 1B. For clarity of the present inventive concepts, some components of FIG. 1B will be omitted in FIG. 1A.

Referring to FIGS. 1A, 1B, and 1C, the semiconductor package device 1 according to the present inventive concepts may include a first semiconductor package PK1 and a second semiconductor package PK2 on the first semiconductor package PK1. The semiconductor package device 1 may have a package-on-package structure.

The first semiconductor package PK1 may include a lower redistribution substrate 1000, a first semiconductor chip 700, an upper redistribution substrate 2000, conductive pillars 930, and a first molding member 750.

The lower redistribution substrate 1000 may include a first photosensitive dielectric layer 10, a first redistribution layer 100, a second redistribution layer 200, and a third redistribution layer 300 that are sequentially stacked. Although FIG. 1A depicts that the lower redistribution substrate 1000 includes three redistribution layers, one or more redistribution layers may be added to or omitted from the lower redistribution substrate 1000.

The lower redistribution substrate 1000 may have a first surface 1000a and a second surface 1000b that face each other. A first direction D1 is defined to refer to a direction parallel to the first surface 1000a of the lower redistribution substrate 1000. A second direction D2 is defined to refer to a direction parallel to the first surface 1000a of the lower redistribution substrate 1000 and orthogonal to the first direction D1. A third direction D3 is defined to refer to a direction perpendicular to the first surface 1000a of the lower redistribution substrate 1000.

Under-bump patterns 910 may be provided in the first photosensitive dielectric layer 10. The first photosensitive dielectric layer 10 may include one or more of photosensitive polyimide, polybenzoxazole, phenolic polymers, and benzocyclobutene polymers. The under-bump patterns 910 may include metal, for example, copper.

The first redistribution layer 100 may include first redistribution patterns 110 and a first dielectric layer 120. The second redistribution layer 200 may include second redistribution patterns 210 and a second dielectric layer 220. The third redistribution layer 300 may include third redistribution patterns 310 and a third dielectric layer 320.

The first, second, and third dielectric layers 120, 220, and 320 may include or may be formed of one or more of photosensitive polyimide, polybenzoxazole, phenolic polymers, and benzocyclobutene polymers.

According to some example embodiments, no boundary may be found between two adjacent layers among the first photosensitive dielectric layer 10, and the first, second, and third dielectric layers 120, 220, and 320. For example, the first photosensitive dielectric layer 10 and the first, second, and third dielectric layers 120, 220, and 320 may be seen as a single dielectric layer.

Each of the first, second, and third redistribution patterns 110, 210, and 310 may include a seed/barrier pattern 11 and a conductive pattern 21. The seed/barrier pattern 11 may include copper/titanium. The conductive pattern 21 may include copper.

A boundary may be found between the seed/barrier pattern 11 and the conductive pattern 21. The seed/barrier pattern 11 may be provided locally on a bottom surface of the conductive pattern 21. The seed/barrier pattern 11 is not provided on a lateral surface of the conductive pattern 21. Therefore, the bottom surface of each of the conductive patterns 21 may contact the seed/barrier pattern 11, and the lateral surface of each of the conductive patterns 21 may contact a corresponding one of the first, second, and third dielectric layers 120, 220, and 320. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

Each of the first, second, and third redistribution patterns 110, 210, and 310 may include a via part V1 and a line part L1 that are integrally connected to each other. The line part L1 may be provided on and connected to the via part V1. The line part L1 may have a length greater than that of the via part V1. The line part L1 may have a major axis that extends in the first direction D1 or the second direction D2. The line part L1 may be a portion that extends parallel to the first direction D1 or the second direction D2, and the via part V1 may be a portion that protrudes from the line part L1 toward the second surface 1000b of the lower redistribution substrate 1000. The via parts V1 may correspondingly fill via holes VH in the first photosensitive dielectric layer 10 and the first, second, and third dielectric layers 120, 220, and 320. The via part V1 of each of the first redistribution patterns 110 may contact a top surface of the under-bump pattern 910. The via part V1 of each of the second redistribution patterns 210 may contact a top surface of the line part L1 included in the first redistribution pattern 110. The via part V1 of each of the third redistribution patterns 310 may contact a top surface of the line part L1 included in the second redistribution pattern 210.

First lower bonding pads 611 and second lower bonding pads 612 may be provided on the third redistribution patterns 310. A seed/barrier pattern 11 may be interposed between each of the third redistribution patterns 310 and each of the first and second lower bonding pads 611 and 612. The first and second lower bonding pads 611 and 612 may include copper. The first lower bonding pads 611 may contact corresponding conductive pillars 930 which will be discussed below, and the second lower bonding pads 612 may contact corresponding first connection terminals 708 which will be discussed below.

The first semiconductor chip 700 may be provided on the lower redistribution substrate 1000. The first semiconductor chip 700 may be, for example, a logic chip. The first semiconductor chip 700 may be disposed on the lower redistribution substrate 1000 such that first chip pads 705 of the first semiconductor chip 700 face the lower redistribution substrate 1000.

First connection terminals 708 may be in contact with and electrically connected to the second lower bonding pads 612 and the first chip pads 705. The first semiconductor chip 700 may be electrically connected, through the first connection terminals 708, to the lower redistribution substrate 1000. The first connection terminals 708 may include one or more of solder, pillar, and bump. The first connection terminals 708 may include a conductive material, such as tin (Sn) and silver (Ag).

The conductive pillars 930 may be provided on the lower redistribution substrate 1000 and in the first molding member 750. The conductive pillars 930 may be disposed laterally spaced apart from the first semiconductor chip 700. The conductive pillars 930 may contact the first lower bonding pads 611. The conductive pillars 930 may be electrically connected, through the first, second, and third redistribution patterns 110, 210, and 310, to the first semiconductor chip 700 or external bonding terminals 908. The conductive pillars 930 may include, for example, copper.

The first molding member 750 may be formed on and cover the lower redistribution substrate 1000. The first molding member 750 may cover the third dielectric layer 320 and a lateral surface of an under-fill layer 720. The first molding member 750 may expose top surfaces of the conductive pillars 930, while covering sidewalls of the conductive pillars 930. The first molding member 750 may cover top and lateral surfaces of the first semiconductor chip 700.

The external bonding terminals 908 may be disposed on the first photosensitive dielectric layer 10. The external bonding terminals 908 may vertically overlap corresponding under-bump patterns 910. The external bonding terminals 908 may contact the corresponding under-bump patterns 910. The external bonding terminals 908 may be coupled to the first chip pads 705 through the under-bump patterns 910 and the first, second, and third redistribution patterns 110, 210, and 310. Therefore, the external bonding terminals 908 are not vertically aligned with the first chip pads 705. At least one of the external bonding terminals 908 is not vertically overlap the first semiconductor chip 700. In an embodiment, the external bonding terminals 908 which are disposed on an outer region of the second surface 1000*b* of the lower redistribution substrate 1000 do not vertically overlap the first chip pads 705. Therefore, the use of the lower redistribution substrate 1000 may increase the degree of freedom in arranging the first chip pads 705 or the external bonding terminals 908. The semiconductor package device 1 may be a fan-out semiconductor package device formed in a chip-last process.

The upper redistribution substrate 2000 may be disposed on a top surface of the first molding member 750 and the top surfaces of the conductive pillars 930.

The upper redistribution substrate 2000 may include a second photosensitive dielectric layer 20, a fourth redistribution layer 400, and a fifth redistribution layer 500. Although the upper redistribution substrate 2000 is illustrated to include two redistribution layers 400 and 500, one or more redistribution layers may further be included in or omitted from the upper redistribution substrate 2000. The fourth redistribution layer 400 may be substantially the same as one of the first and second redistribution layers 100 and 200 that are discussed above. The fifth redistribution layer 500 may be substantially the same as the third redistribution layer 300 discussed above. The fourth redistribution layer 400 may include fourth redistribution patterns 410 and a fourth dielectric layer 420. The fifth redistribution layer 500 may include fifth redistribution patterns 510 and a fifth dielectric layer 520. The fifth redistribution layer 500 may be an uppermost redistribution layer. Each of the fourth and fifth redistribution patterns 410 and 510 may include a via part V1 and a line part L1 that are integrally connected to each other. The via part V1 of the fourth redistribution pattern 410 may contact the top surface of the conductive pillar 930. The via part V1 of the fifth redistribution patterns 510 may contact a top surface of the line part L1 included in the fourth redistribution pattern 410.

The second photosensitive dielectric layer 20 and the fourth and fifth dielectric layers 420 and 520 may include one or more of photosensitive polyimide, polybenzoxazole, phenolic polymers, and benzocyclobutene polymers. According to some example embodiments, no boundary may be found between two adjacent layers among the second photosensitive dielectric layer 20, and the fourth and fifth dielectric layers 420 and 520. The second photosensitive dielectric layer 20 and the fourth and fifth dielectric layers 420 and 520 may be seen as a single dielectric layer.

First upper bonding pads 621, second upper bonding pads 622, and third upper bonding pads 623 may be provided on the line parts L1 of the fifth redistribution patterns 510. A seed/barrier pattern 11 may be interposed between the fifth redistribution pattern 510 and each of the first, second, and third upper bonding pads 621, 622, and 623. The first, second, and third upper bonding pads 621, 622, and 623 will be further discussed below.

The second semiconductor package PK2 may be provided on the upper redistribution substrate 2000. The second semiconductor package PK2 may include a package substrate 810, a second semiconductor chip 800, and a second molding member 850. The package substrate 810 may be a printed circuit board or a redistribution substrate. Metal pads 815 and 817 may be disposed on opposite surfaces of the package substrate 810.

The second semiconductor chip 800 may be a memory chip, for example, dynamic random access memory (DRAM) or NAND Flash. The second semiconductor chip 800 may be of a different type from the first semiconductor chip 700. The second semiconductor chip 800 may have, on its surface, second chip pads 805 that are wire-bonded to the metal pads 815 of the package substrate 810.

Second connection terminals 808 may be disposed between the first semiconductor package PK1 and the second semiconductor package PK2. The second connection terminals 808 may contact the metal pads 817 and the first, second, and third upper bonding pads 621, 622, and 623.

The second connection terminals 808 may be electrically connected to the metal pads 817 and the first, second, and third upper bonding pads 621, 622, and 623. Therefore, the second semiconductor package PK2 may be electrically connected to the first semiconductor chip 700 and the external bonding terminals 908 through the upper redistribution substrate 2000, the second connection terminals 808, and the conductive pillars 930.

Referring back to FIG. 1A, the first upper bonding pads 621 may be disposed most adjacent to a central portion of a top surface 2000*a* of the upper redistribution substrate 2000. The third upper bonding pads 623 may be disposed most adjacent to an edge portion of the top surface 2000*a* of the upper redistribution substrate 2000. The first upper bonding pads 621 may be called inner upper bonding pads. The third upper bonding pads 623 may be called outer upper bonding pads.

The first, second, and third upper bonding pads 621, 622, and 623 may be arranged along the first direction D1 or the second direction D2. Each of the first, second, and third upper bonding pads 621, 622, and 623 may have an exposed top surface shaped like a circle or near-circle, when the semiconductor package device 1 is viewed in a plan view. According to some example embodiments, when the semiconductor package device 1 is viewed in the plan view, each of the first, second, and third upper bonding pads 621, 622, and 623 may have a top surface shaped like a tetragon or near-tetragon.

When a first imaginary line extends to pass through centers at the top surfaces of the first upper bonding pads 621, the first imaginary line may form a tetragonal shape (e.g., a rectangle). When second and third imaginary lines extend to pass through centers at the top surfaces of the second upper bonding pads 622 and the third upper bonding pads 623, respectively, each of the second and third imaginary lines may also form a tetragonal shape. The second upper bonding pads 622 may surround the first upper bonding pads 621, and the third upper bonding pads 623 may surround the second upper bonding pads 622. For example, the first upper bonding pads 621 may be arranged along the first imaginary line to form a shape of a first rectangle, the second upper bonding pads 622 may be arranged along the second imaginary line to form a shape of a second rectangle, and the third upper bonding pads 623 may be arranged along the third imaginary line to form a shape of a third rectangle. The first to third rectangles may be concentric with each other.

Referring to FIGS. 1A to 1C, the first, second, and third upper bonding pads 621, 622, and 623 may each have top and lateral surfaces that are exposed by the fifth dielectric layer 520. Each of the first, second, and third upper bonding pads 621, 622, and 623 may include a connection via part CV, which may be provided in the fifth dielectric layer 520.

The first upper bonding pad 621 may include a first metal pattern 621a and a second metal pattern 621b that are sequentially stacked. The second upper bonding pad 622 may include a third metal pattern 622a and a fourth metal pattern 622b that are sequentially stacked. The third upper bonding pad 623 may include a fifth metal pattern 623a and a sixth metal pattern 623b that are sequentially stacked. The first, third, and fifth metal patterns 621a, 622a, and 623a may include a first metallic material, such as copper. The second, fourth, and sixth metal patterns 621b, 622b, and 623b may include a second metallic material, such as nickel, gold and an alloy thereof.

The first upper bonding pad 621 may have a first thickness T1 at a portion that protrudes from a top surface of the fifth dielectric layer 520, and the first thickness T1 may be a distance in the third direction D3 from the top surface 2000a of the upper redistribution substrate 2000 to the top surface of the first upper bonding pad 621. The top surface 2000a of the upper redistribution substrate 2000 may correspond to a top surface of the fifth dielectric layer 520. The second upper bonding pad 622 may have a second thickness T2 at its portion that protrudes from the top surface of the fifth dielectric layer 520, and the second thickness T2 may be a distance in the third direction D3 from the top surface 2000a of the upper redistribution substrate 2000 to the top surface of the second upper bonding pad 622. The third upper bonding pad 623 may have a third thickness T3 at its portion that protrudes from the top surface of the fifth dielectric layer 520, and the third thickness T3 may be a distance in the third direction D3 from the top surface 2000a of the upper redistribution substrate 2000 to the top surface of the third upper bonding pad 623.

The second thickness T2 may be greater than the first thickness T1, and the third thickness T3 may be greater than the second thickness T2. The third thickness T3 may be greater than about 1 times and less than about 2 times the first thickness T1. The first thickness T1 of the inner upper bonding pad 621 may have a value from about 2 μm to about 6 μm, and the third thickness T3 of the outer upper bonding pad 623 may have a value from about 7 μm to about 10 μm. For example, the first thickness T1 may be about 5 μm, the second thickness T2 may be about 7.5 μm, and the third thickness T3 may be about 10 μm. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The third metal pattern 622a may have a thickness greater than that of the first metal pattern 621a, and the fifth metal pattern 623a may have a thickness greater than that of the third metal pattern 622a. The fourth metal pattern 622b may have a thickness greater than that of the second metal pattern 621b, and the sixth metal pattern 623b may have a thickness greater than that of the fourth metal pattern 622b.

The first upper bonding pad 621 may have a first diameter W1 in the first direction D1. The second upper bonding pad 622 may have a second diameter W2 in the first direction D1. The third upper bonding pad 623 may have a third diameter W3 in the first direction D1. The second diameter W2 may be greater than the third diameter W3, and the first diameter W1 may be greater than the second diameter W2. The first diameter W1 may be greater than about 1 times and less than about 2 times the third diameter W3.

The first diameter W1 of the inner upper bonding pad 621 may have a value from about 180 μm to about 240 μm, and the third diameter W3 of the outer upper bonding pad 623 may have a value from about 100 μm to about 160 μm. For example, the first diameter W1 may be about 240 μm, the second diameter W2 may be about 200 μm, and the third diameter W3 may be about 160 μm.

The second connection terminals 808 connected to the first, second, and third upper bonding pads 621, 622, and 623 may have different shapes from each other. The second connection terminals 808 may include, for example, a solder ball. The second connection terminals 808 may have substantially the same weight.

Figure 2A:
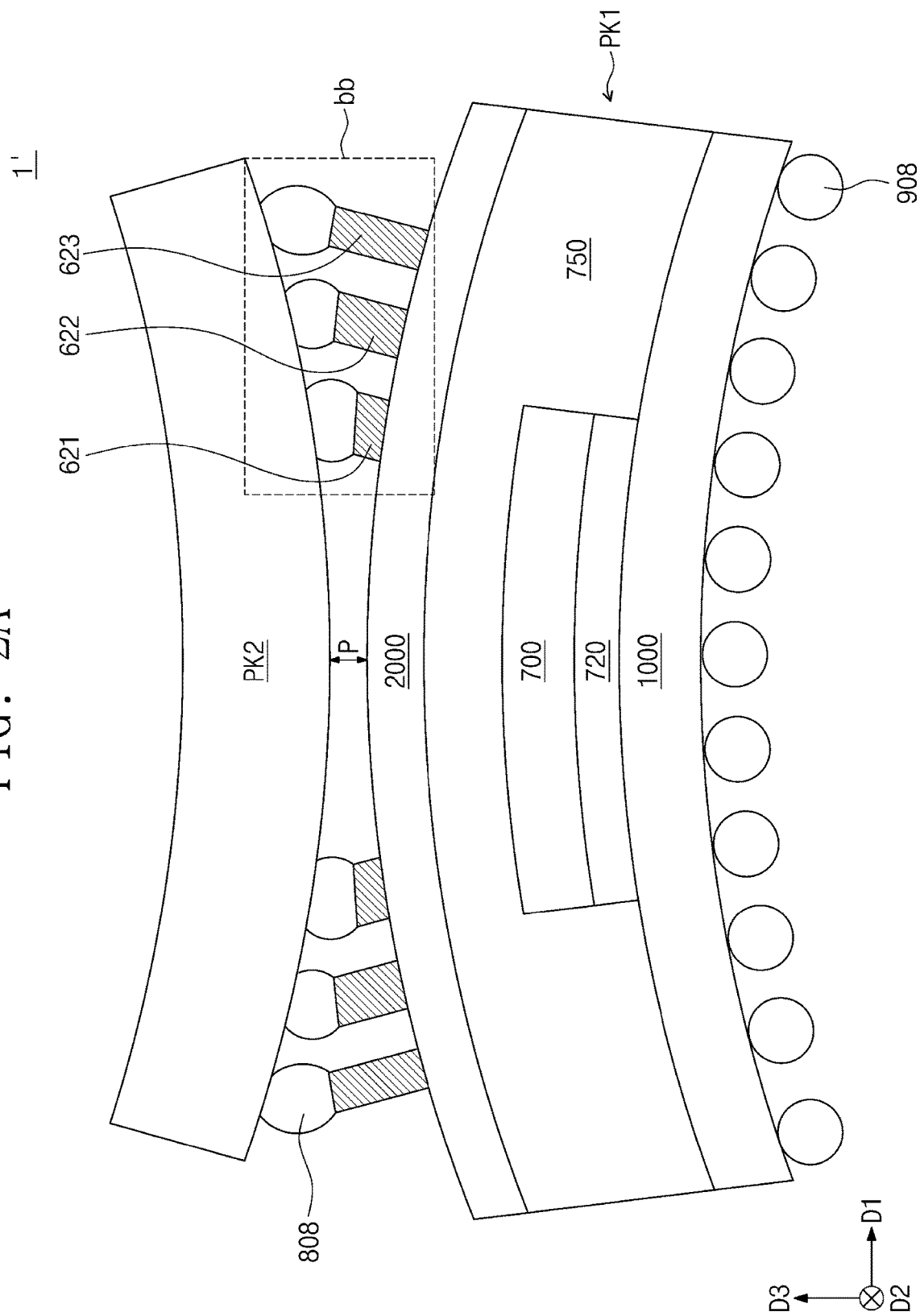
FIG. 2A illustrates a conceptual view showing warpage of the semiconductor package device depicted in FIG. 1A.
Figure 2B:
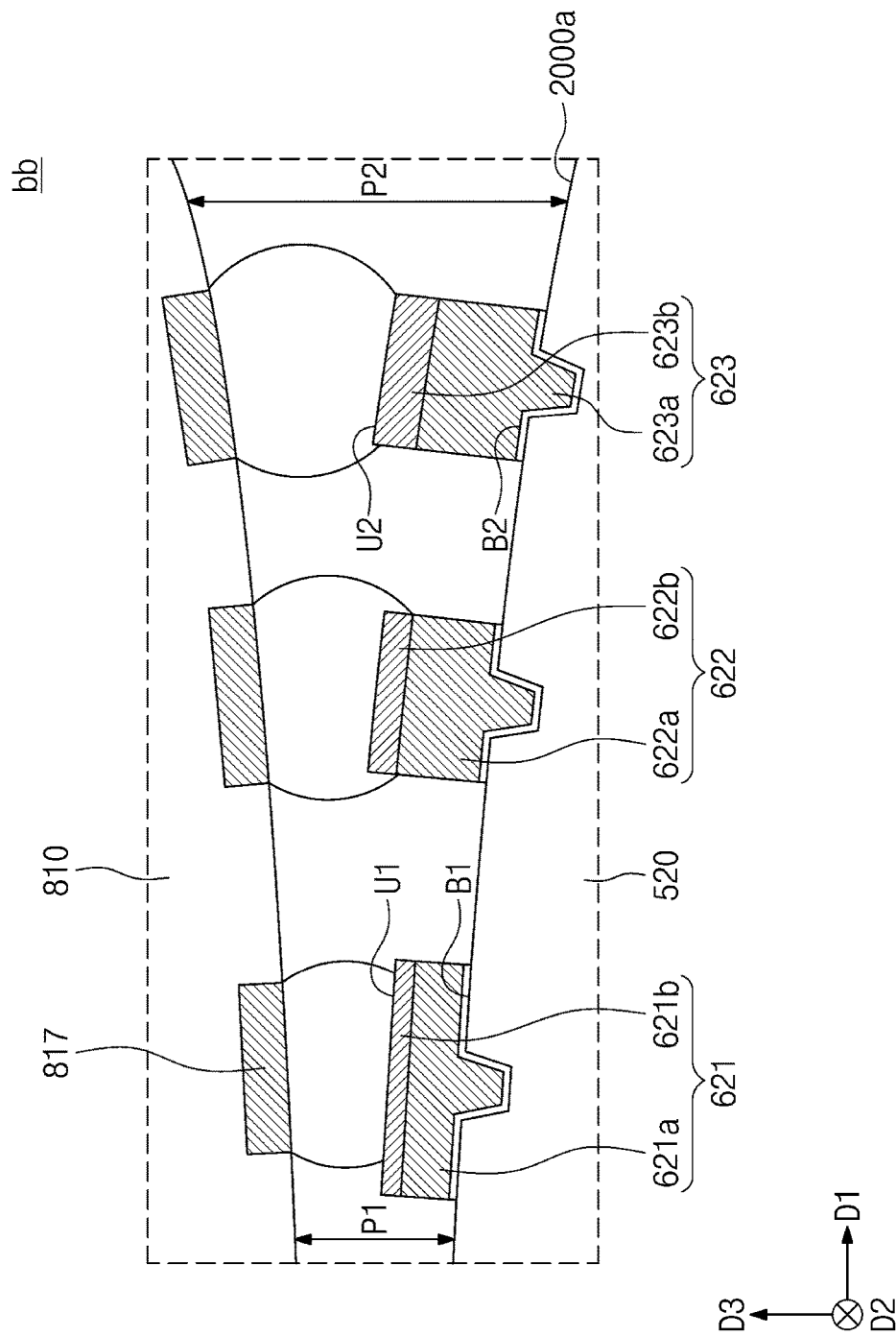
FIG. 2B illustrates an enlarged view showing section bb of FIG. 2A.

FIG. 2A illustrates a conceptual view showing warpage of the semiconductor package device depicted in FIG. 1A. FIG. 2B illustrates an enlarged view showing section bb of FIG. 2A. Some of the components shown in FIG. 1B are omitted from FIG. 2A. Omission will be made to avoid a repetitive description in connection with FIGS. 1A to 1C.

Referring to FIGS. 2A and 2B, warpage may occur at one or both of the first and second semiconductor packages PK1 and PK2. For example, a "crying" warpage may occur at the first semiconductor package PK1, and a "smiling" warpage may occur at the second semiconductor package PK2. A spacing distance P between the second semiconductor package PK2 and the top surface 2000a of the upper redistribution substrate 2000 may increase in a direction from a central portion at the top surface 2000a of the upper redistribution substrate 2000 to an outer portion at the top surface 2000a of the upper redistribution substrate 2000. The central portion at the top surface 2000a of the upper redistribution substrate 2000 may be located at a higher level than that of the outer portion at the top surface 2000a of the upper redistribution substrate 2000. The second semiconductor package PK2 and the top surface 2000a of the upper redistribution substrate 2000 may have, at a location adjacent to the inner upper bonding pad 621, a first spacing distance P1 less than a second spacing distance P2 at a location adjacent to the outer upper bonding pad 623.

The occurrence of warpage may cause the first, second, and third upper bonding pads 621, 622, and 623 to be arranged inclined along the top surface 2000a of the upper redistribution substrate 2000. The inner upper bonding pad 621 may have a bottom surface B1 whose lowermost level is higher than that of a bottom surface B2 of the outer upper bonding pad 623. The inner upper bonding pad 621 may have a top surface U1 whose uppermost level is the same as or different from that of a top surface U2 of the outer upper bonding pad 623. A difference in lowermost level between the bottom surface B1 of the inner upper bonding pad 621 and the bottom surface B2 of the outer upper bonding pad 623 may be greater than a difference in uppermost level between the top surface U1 of the inner upper bonding pad 621 and the top surface U2 of the outer upper bonding pad 623.

The first semiconductor package PK1 may experience the warpage during or after fabrication. For example, as the lower redistribution substrate 1000 is generally thicker than the upper redistribution substrate 2000, the lower redistribution substrate 1000 may include a dielectric material whose amount is greater than that of a dielectric material included in the upper redistribution substrate 2000. The under-fill layer 720 may be positioned in a lower portion of the first semiconductor package PK1. As dielectric materials have their large coefficient of thermal expansion, the first semiconductor package PK1 may significantly contract at its lower portion to induce the "crying" warpage.

According to the present inventive concepts, because the third thickness T3 of the outer upper bonding pad 623 is greater than the first thickness T1 of the inner upper bonding pad 621, even when the warpage causes the spacing distance P, between the second semiconductor package PK2 and the top surface 2000a of the upper redistribution substrate 2000, to increase in a direction from a center portion at the top surface 2000a of the upper redistribution substrate 2000 to an outer portion at the top surface 2000a of the upper redistribution substrate 2000, the outer upper bonding pads 623 may contact the second connection terminals 808. Therefore, the second semiconductor package PK2 may be electrically connected to the first semiconductor package PK1 through the second connection terminals 808 and the outer upper bonding pads 623, with the result that a semiconductor package device 1' may increase in reliability.

FIG. 2B shows that warpage occurs to both the first semiconductor package PK1 and the second semiconductor package PK2. In an embodiment, warpage does not occur or may barely occur to the second package PK2 compared to the warpage of the first package PK1. A spacing distance P between the second semiconductor package PK2 and the top surface 2000a of the upper redistribution substrate 2000 may increase in a direction from a central portion at the top surface 2000a of the upper redistribution substrate 2000 to an outer portion at the top surface 2000a of the upper redistribution substrate 2000. Except that the second package PK2 has substantially flat bottom surface, the configuration of the semiconductor package device 1' may be similar to that of the semiconductor package device 1. The description of the similar configuration will be omitted for the brevity of description.

Figure 3:
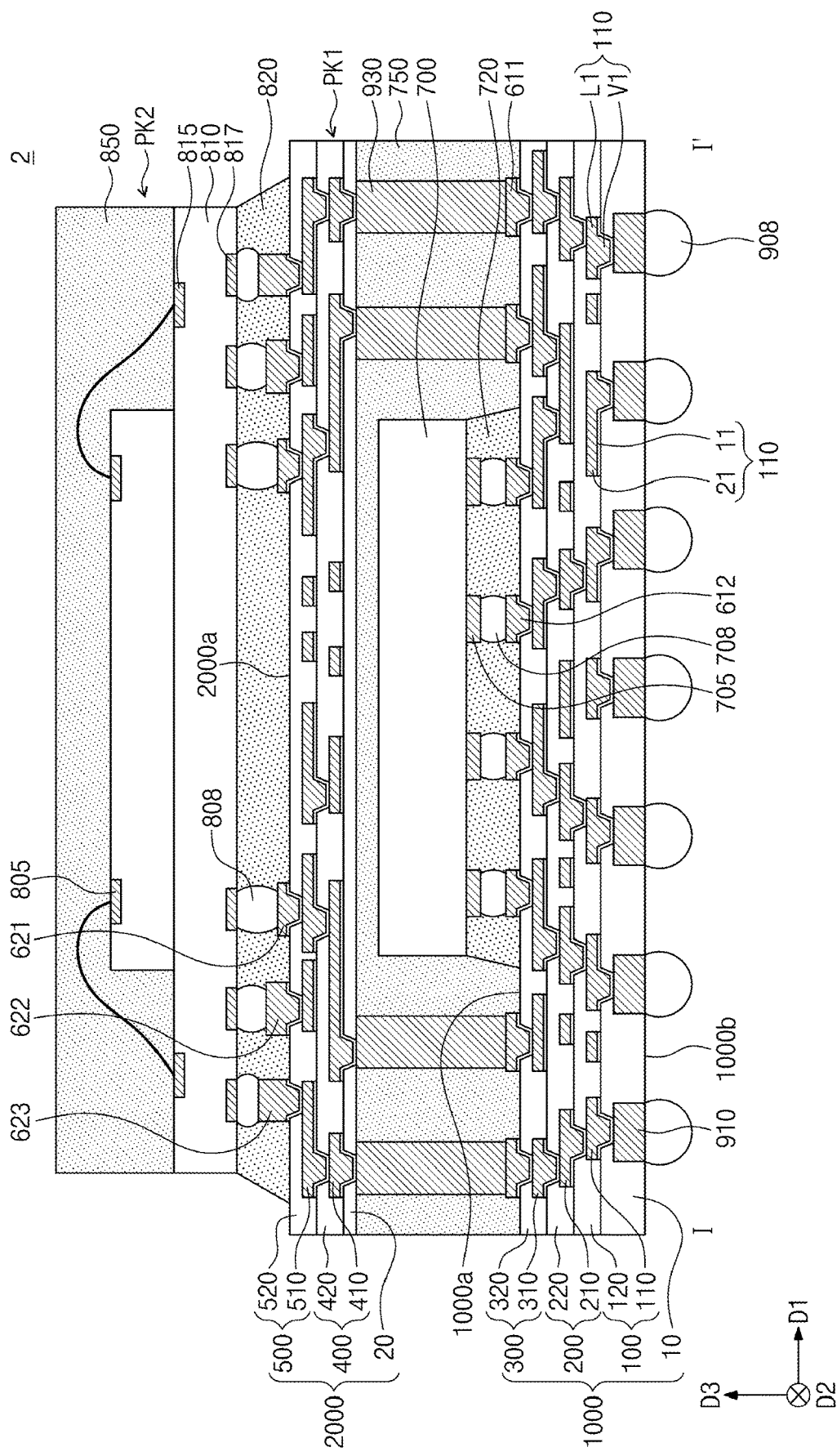
FIG. 3 illustrates a cross-sectional view taken along line I-I' of FIG. 1A, showing a semiconductor package device according to some example embodiments of the present inventive concepts.

FIG. 3 illustrates a cross-sectional view taken along line I-I' of FIG. 1A, showing a semiconductor package device 2 according to some example embodiments of the present inventive concepts. Omission will be made to avoid a repetitive description in connection with FIGS. 1A to 1C.

Referring to FIG. 3, a first under-fill layer may be defined to indicate the under-fill layer 720 between the first semiconductor chip 700 and the lower redistribution substrate 1000. A second under-fill layer 820 may be interposed between the upper redistribution substrate 2000 and the second semiconductor package PK2. The second under-fill layer 820 may cover top and lateral surfaces of the first, second, and third upper bonding pads 621, 622, and 623. The second under-fill layer 820 may cover lateral surfaces of the second connection terminals 808.

FIGS. 4A, 4B, 4C, 4D, 4E, 4F, 4H, 4J, 4K, and 4L illustrate cross-sectional views showing a method of fabricating the semiconductor package device of FIG. 1B. FIG. 4G illustrates an enlarged view showing section cc of FIG. 4F. FIG. 4I illustrates an enlarged view showing section dd of FIG. 4H. Omission will be made to avoid a repetitive description in connection with FIGS. 1A to 1C.

Figure 4A:
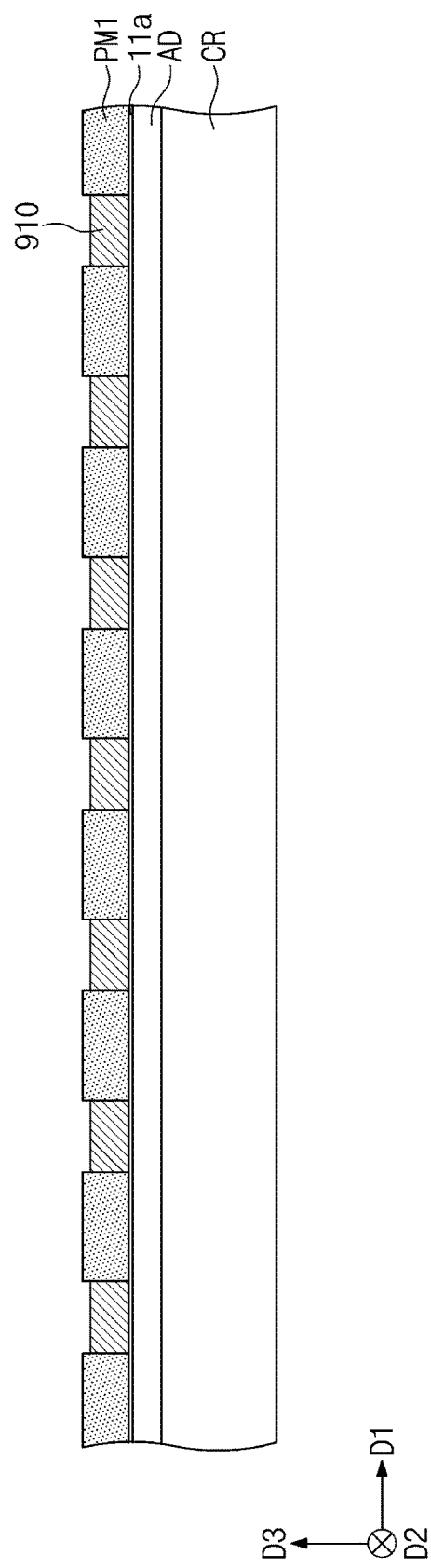
FIGS. 4A, 4B, 4C, 4D, 4E, 4F, 4H, 4J, 4K, and 4L illustrate cross-sectional views showing a method of fabricating the semiconductor package device of FIG. 1B.

Referring to FIG. 4A, there may be provided a carrier substrate CR that has an adhesive layer AD formed on one surface thereof. A first seed layer 11a may be formed on the carrier substrate CR, thereby covering a top surface of the adhesive layer AD. The first seed layer 11a may be formed by a deposition process. The adhesive layer AD may attach the first seed layer 11a to the carrier substrate CR.

A first photomask pattern PM1 may be formed on a top surface of the first seed layer 11a. The first photomask pattern PM1 may include an opening that defines a space in which an under-bump pattern 910 is formed. The first photomask pattern PM1 may be formed by forming, exposing, and developing a photoresist layer. The first photomask pattern PM1 may expose the first seed layer 11a. An electroplating process may be performed to use the first seed layer 11a as an electrode to form the under-bump pattern 910 in the opening.

Figure 4B:
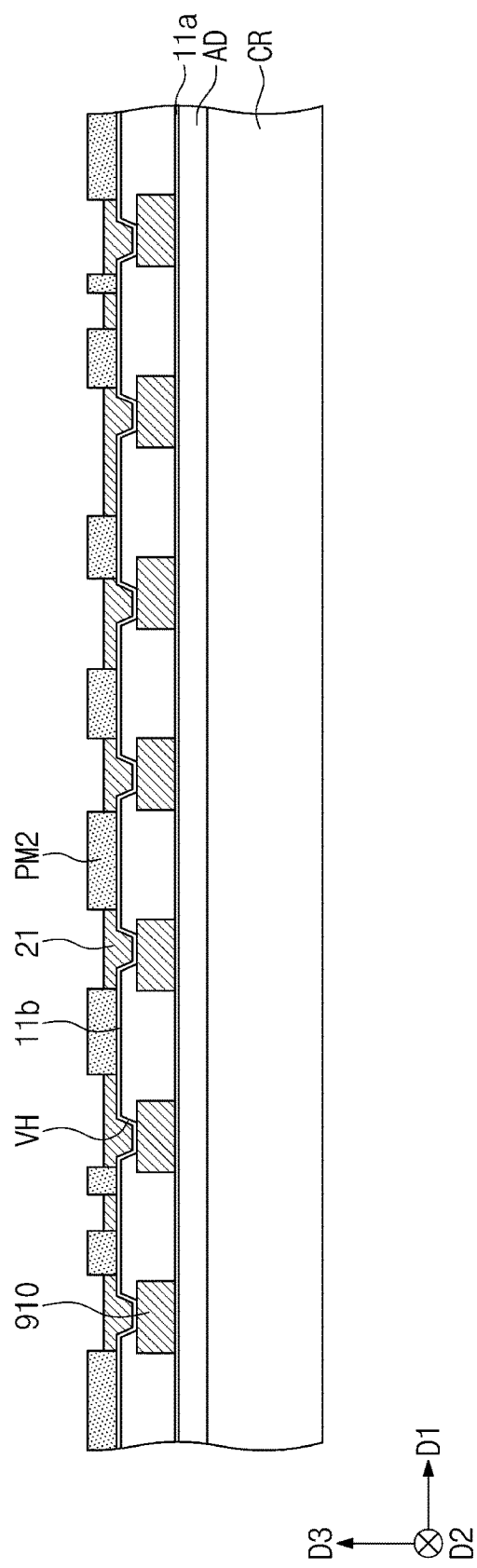

Referring to FIG. 4B, the first photomask pattern PM1 may be removed. A first photosensitive dielectric layer 10 may be formed to cover the under-bump pattern 910. The first photosensitive dielectric layer 10 may be formed by a coating process, such as spin coating or slit coating. Exposure and development processes may cause the first photosensitive dielectric layer 10 to be patterned to have a via hole VH that defines a via part V1 of a first redistribution pattern 110 which will be discussed below. The via hole VH may expose a top surface of the under-bump pattern 910. A curing process may be performed on the first photosensitive dielectric layer 10. A second seed/barrier layer 11b may be formed to cover a top surface of the first photosensitive dielectric layer 10. A second photomask pattern PM2 may be formed on the second seed/barrier layer 11b. The second photomask pattern PM2 may define a region where is formed a line part L1 of a first redistribution pattern 110 which will be discussed below. A conductive pattern 21 may be electroplated on the second seed/barrier layer 11b.

Figure 4C:
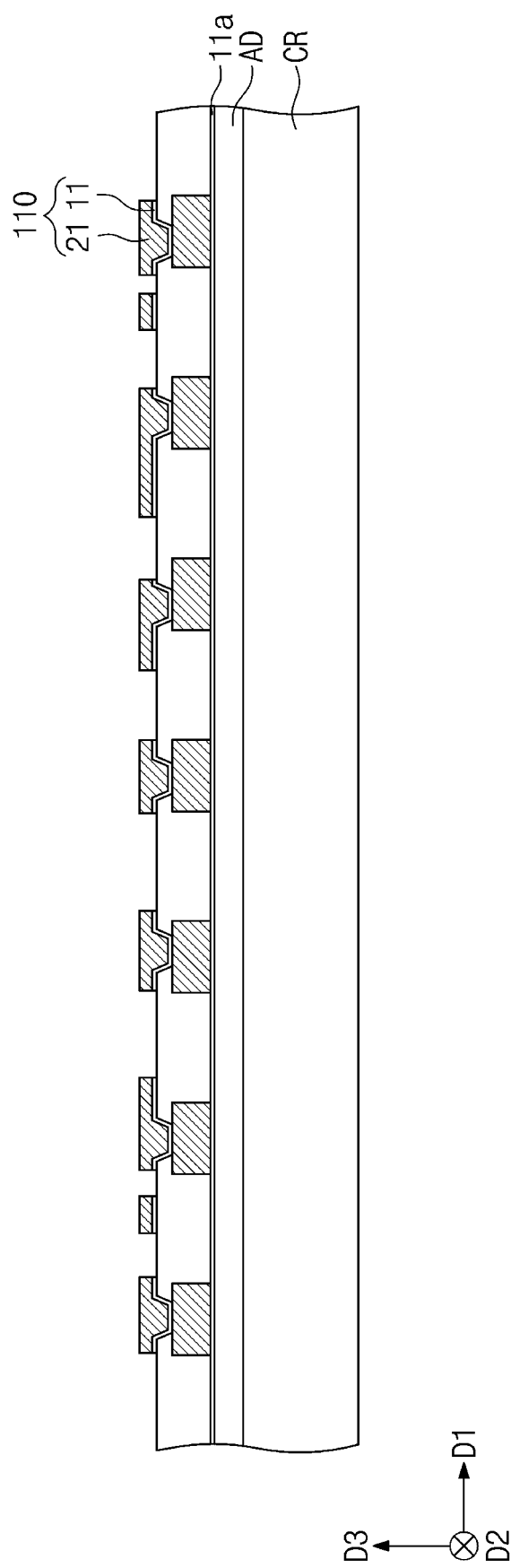

Referring to FIG. 4C, the second photomask pattern PM2 may be removed. An etching process may be performed on the second seed/barrier layer 11b to form a seed/barrier pattern 11. Simultaneously, a first redistribution pattern 110 may be formed which includes the conductive pattern 21 and the seed/barrier pattern 11. The second seed/barrier layer 11b may be removed except for its portion that vertically overlaps the conductive pattern 21. The etching process may be, for example, a wet etching process.

Figure 4D:
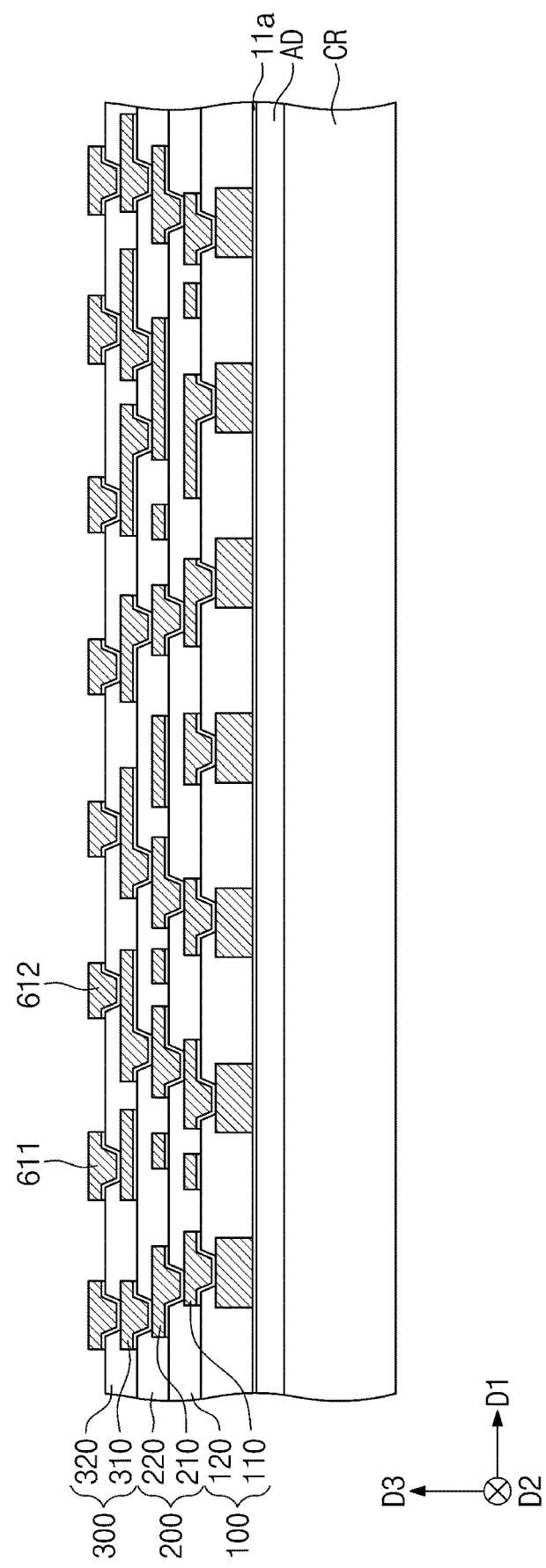

Referring to FIG. 4D, a first dielectric layer 120 may be formed to cover the first redistribution pattern 110 and the first photosensitive dielectric layer 10. The first dielectric layer 120 may be formed by substantially the same method as that used for forming the first photosensitive dielectric layer 10. A first redistribution layer 100 may be formed which includes the first redistribution pattern 110 and the first dielectric layer 120. A second redistribution layer 200 and a third redistribution layer 300 may each be formed by substantially the same method as that used for forming the first redistribution layer 100.

First lower bonding pads 611 and second lower bonding pads 612 may be formed on the third redistribution layer 300. The first lower bonding pads 611 and the second lower bonding pads 612 may be formed by an electroplating process in which a photomask pattern is used as discussed above. Accordingly, a lower redistribution substrate 1000 may be formed.

Figure 4E:
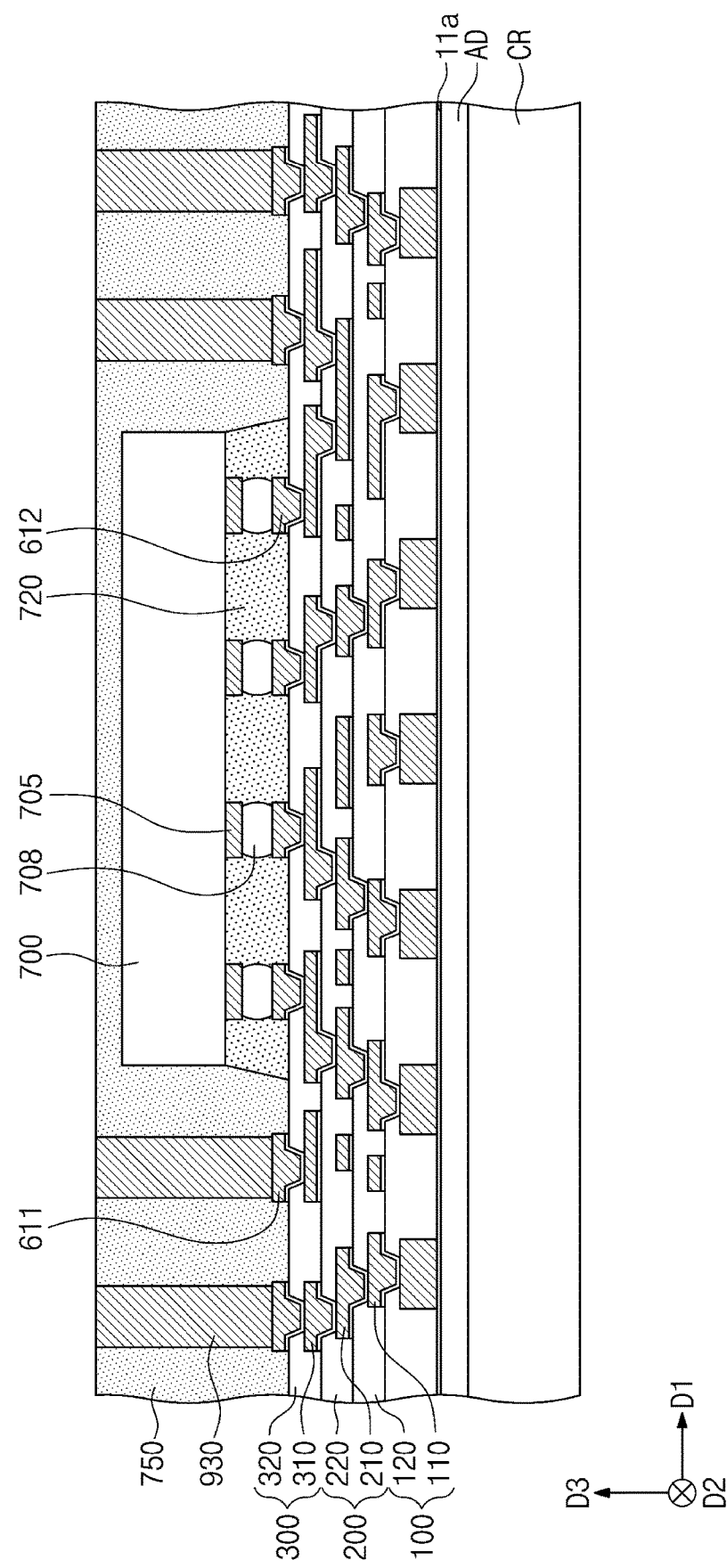

Referring to FIG. 4E, conductive pillars 930 may be formed on corresponding first lower bonding pads 611. The formation of the conductive pillars 930 may include forming a photoresist pattern (not shown) that defines regions where the conductive pillars 930 will be formed, filling a conductive material, and removing the photoresist pattern.

A first semiconductor chip 700 may be disposed on the lower redistribution substrate 1000 so as to allow first chip pads 705 of the first semiconductor chip 700 to face the lower redistribution substrate 1000. A thermal compression process may be performed to dispose the first semiconductor chip 700 onto the lower redistribution substrate 1000. First connection terminals 708 may be attached to top surfaces of corresponding second lower bonding pads 612. An under-fill layer 720 may be formed between the first semiconductor chip 700 and the lower redistribution substrate 1000. A first molding member 750 may be formed to cover a top surface of the lower redistribution substrate 1000, top and lateral surfaces of the first semiconductor chip 700, and lateral surfaces of the conductive pillars 930.

Figure 4F:
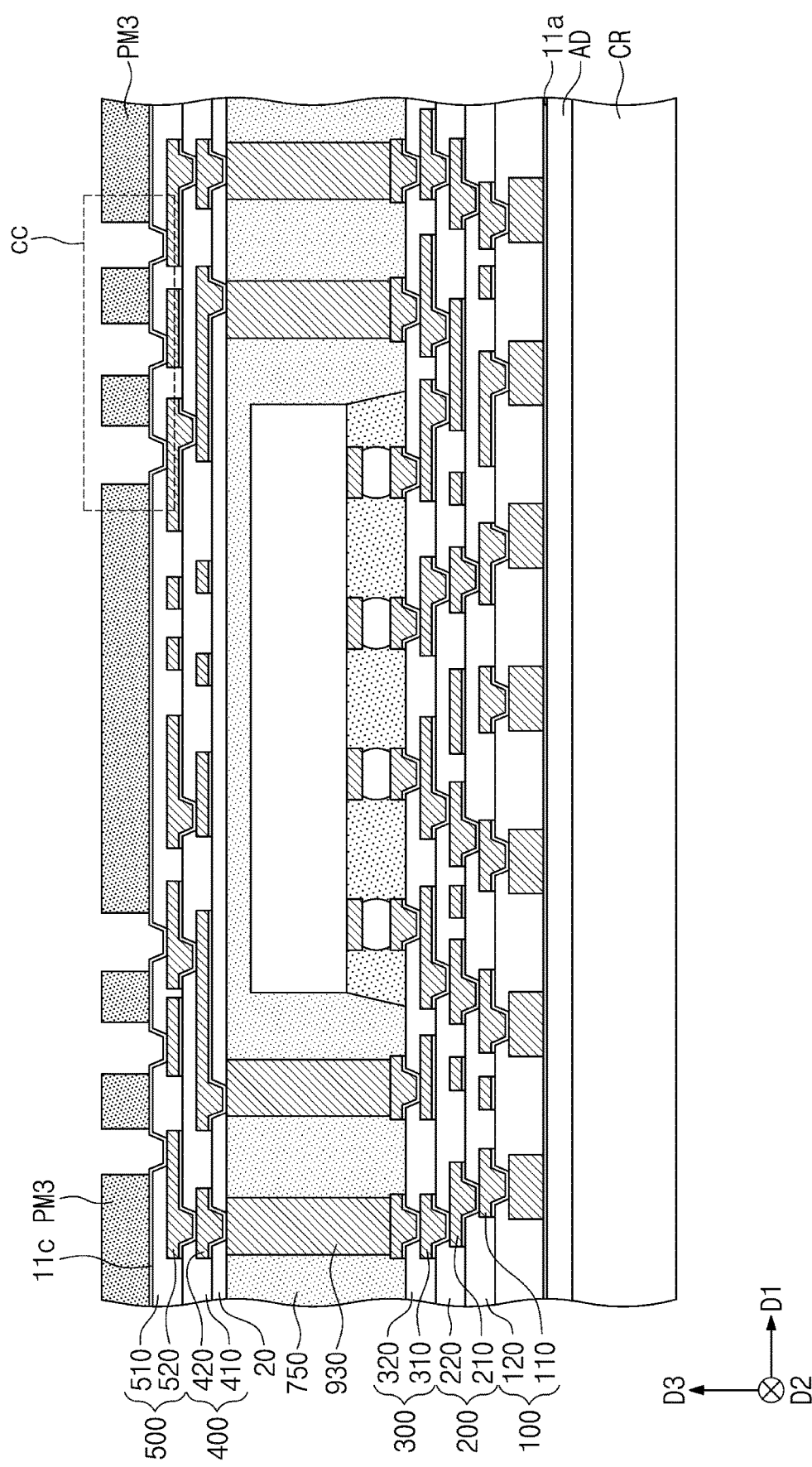
Figure 4G:
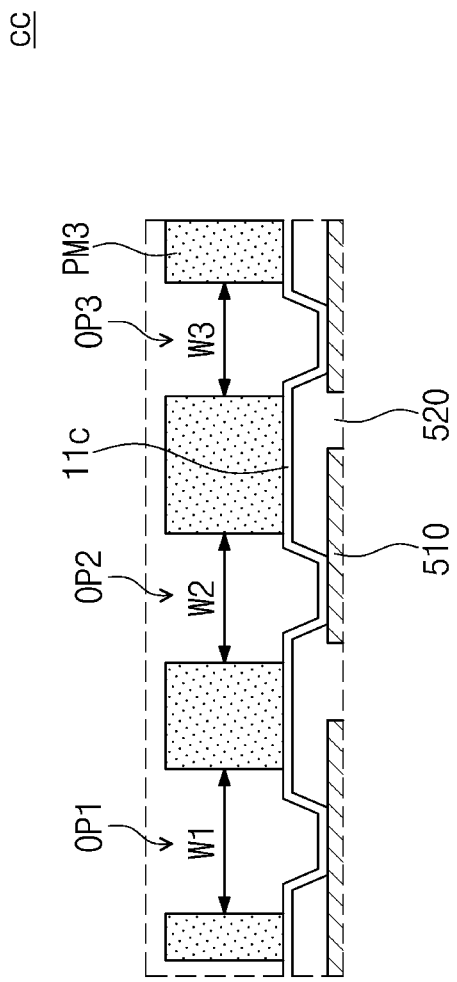
FIG. 4G illustrates an enlarged view showing section cc of FIG. 4F.

Referring to FIG. 4F, a second photosensitive dielectric layer 20, a fourth redistribution layer 400, and a fifth redistribution layer 500 may be sequentially formed on the first molding member 750. The second photosensitive dielectric layer 20 may be formed by substantially the same method as that used for forming the first photosensitive dielectric layer 10. The fourth redistribution layer 400 and the fifth redistribution layer 500 may each be formed by substantially the same method as that used for forming each of the first, second, and third redistribution layers 100, 200, and 300. A third seed/barrier layer 11c and a third photomask pattern PM3 may be formed on the third redistribution layer 300.

Referring to FIGS. 4F and 4G, the third photomask pattern PM3 may include a plurality of first openings OP1, a plurality of second openings OP2, and a plurality of third openings OP3. The first, second, and third openings OP1, OP2, and OP3 may expose the third seed/barrier layer 11c. The first opening OP1 may have a first diameter W1 that corresponds to the first diameter W1 of the first upper bonding pad 621 depicted in FIG. 1C. The second opening OP2 may have a second diameter W2 that corresponds to the second diameter W2 of the second upper bonding pad 622 depicted in FIG. 1C. The third opening OP3 may have a third diameter W3 that corresponds to the third diameter W3 of the third upper bonding pad 623 depicted in FIG. 1C. The second diameter W2 of the second opening OP2 may be less than the first diameter W1 of the first opening OP1, and the third diameter W3 of the third opening OP3 may be less than the second diameter W2 of the second opening OP2.

Figure 4H:
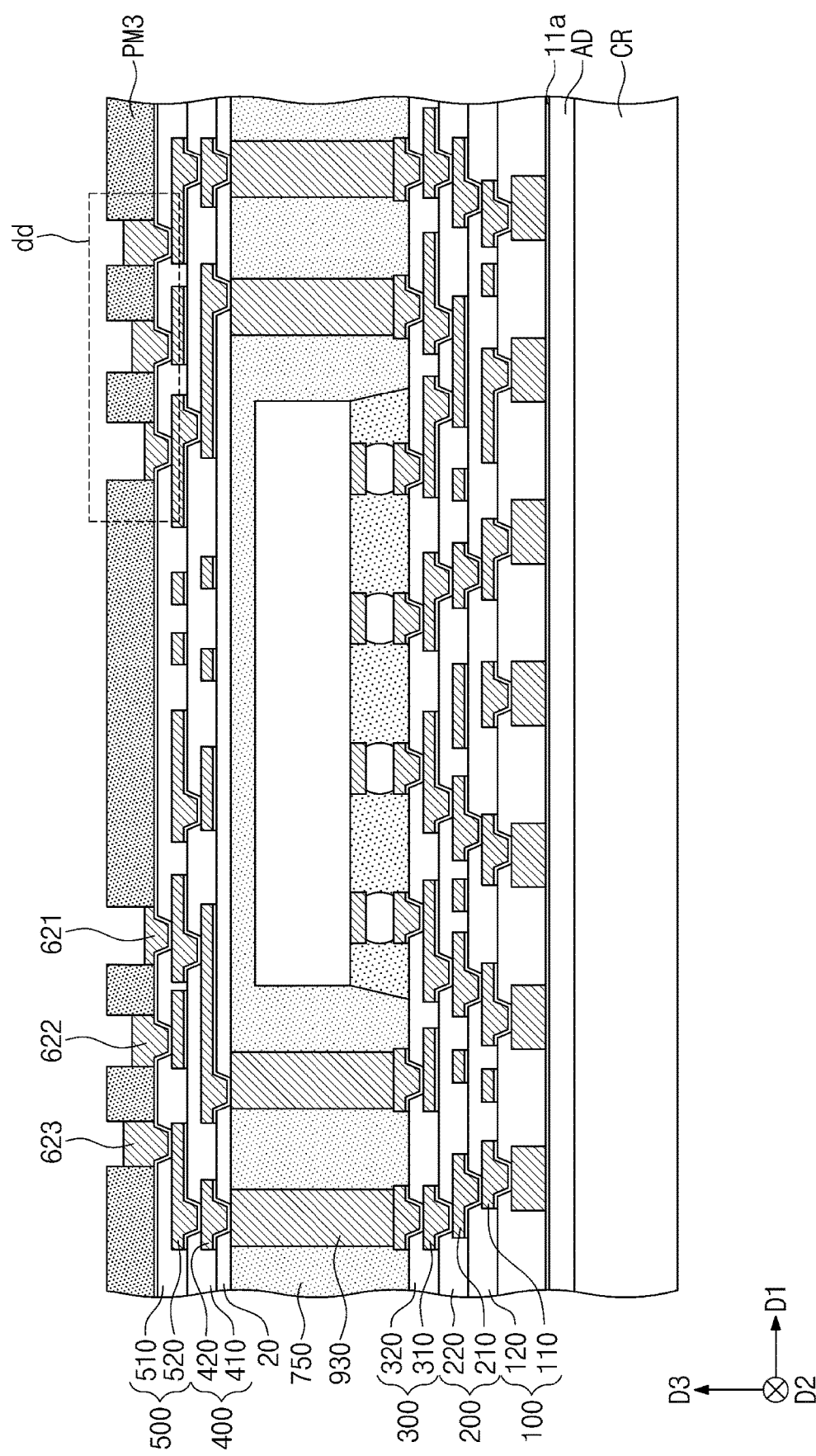
Figure 4I:
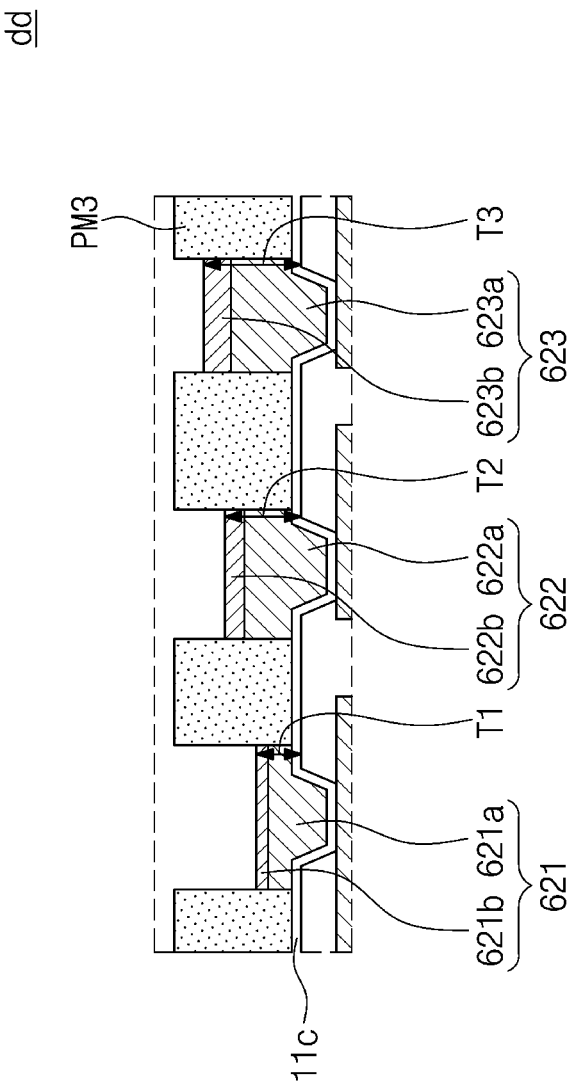
FIG. 4I illustrates an enlarged view showing section dd of FIG. 4H.

Referring to FIG. 4H, an electroplating process may be used to form first upper bonding pads 621, second upper bonding pads 622, and third upper bonding pads 623 may be formed on the third seed/barrier layer 11c.

Referring to FIGS. 4H and 4I, the first upper bonding pad 621, the second upper bonding pad 622, and the third upper bonding pad 623 may be respectively formed in the first opening OP1, the second opening OP2, and the third opening OP3.

In an electroplating process, a plating layer which is formed may have a thickness in inverse proportion to a surface area of the plating layer. For example, a surface area of the third seed/barrier layer 11c exposed to the third opening OP3 may be less than that of the third seed/barrier layer 11c exposed to the second opening OP2. The surface area of the third seed/barrier layer 11c exposed to the second opening OP2 may be less than that of the third seed/barrier layer 11c exposed to the first opening OP1.

As a result, a third thickness T3 of the third upper bonding pad 623 may be greater than a second thickness T2 of the second upper bonding pad 622, and the second thickness T2 of the second upper bonding pad 622 may be greater than a first thickness T1 of the first upper bonding pad 621.

For example, first, second, and third metal patterns 621a, 622a, and 623a may be respectively formed in the first, second, and third openings OP1, OP2, and OP3. Fourth, fifth, and sixth metal patterns 621b, 622b, and 623b may be respectively formed on the first, second, and third metal patterns 621a, 622a, and 623a.

According to the present inventive concepts, the first, second, and third openings OP1, OP2, and OP3 may be controlled to have different sizes from each other during the formation of the first, second, and third upper bonding pads 621, 622, and 623, and thus the first, second, and third upper bonding pads 621, 622, and 623 may be easily adjusted to have different thicknesses from each other.

Figure 4J:
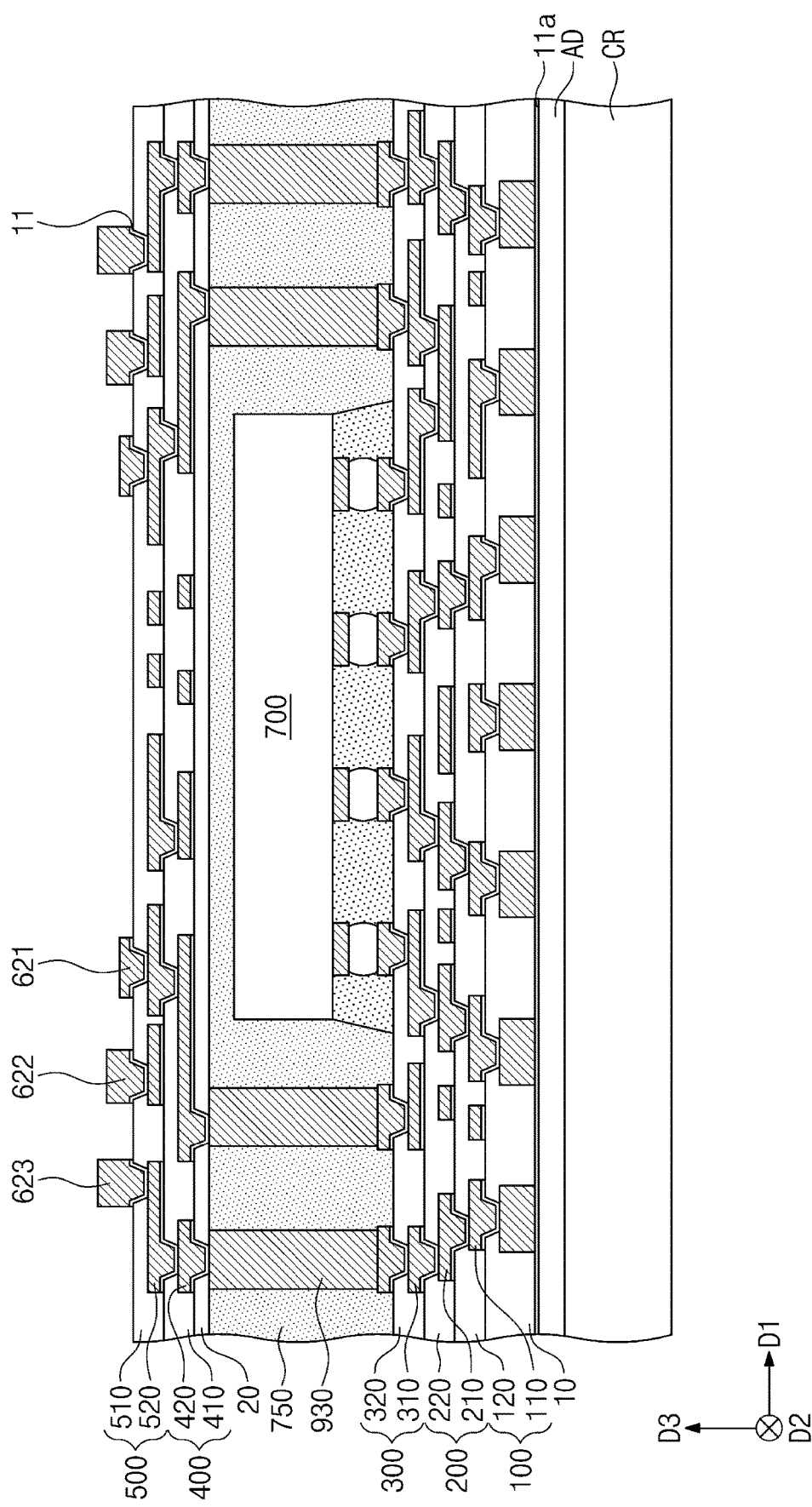

Referring to FIG. 4J, the third photomask pattern PM3 may be removed. A wet etching process may be performed on the third seed/barrier layer 11c to form a seed/barrier pattern 11.

Figure 4K:
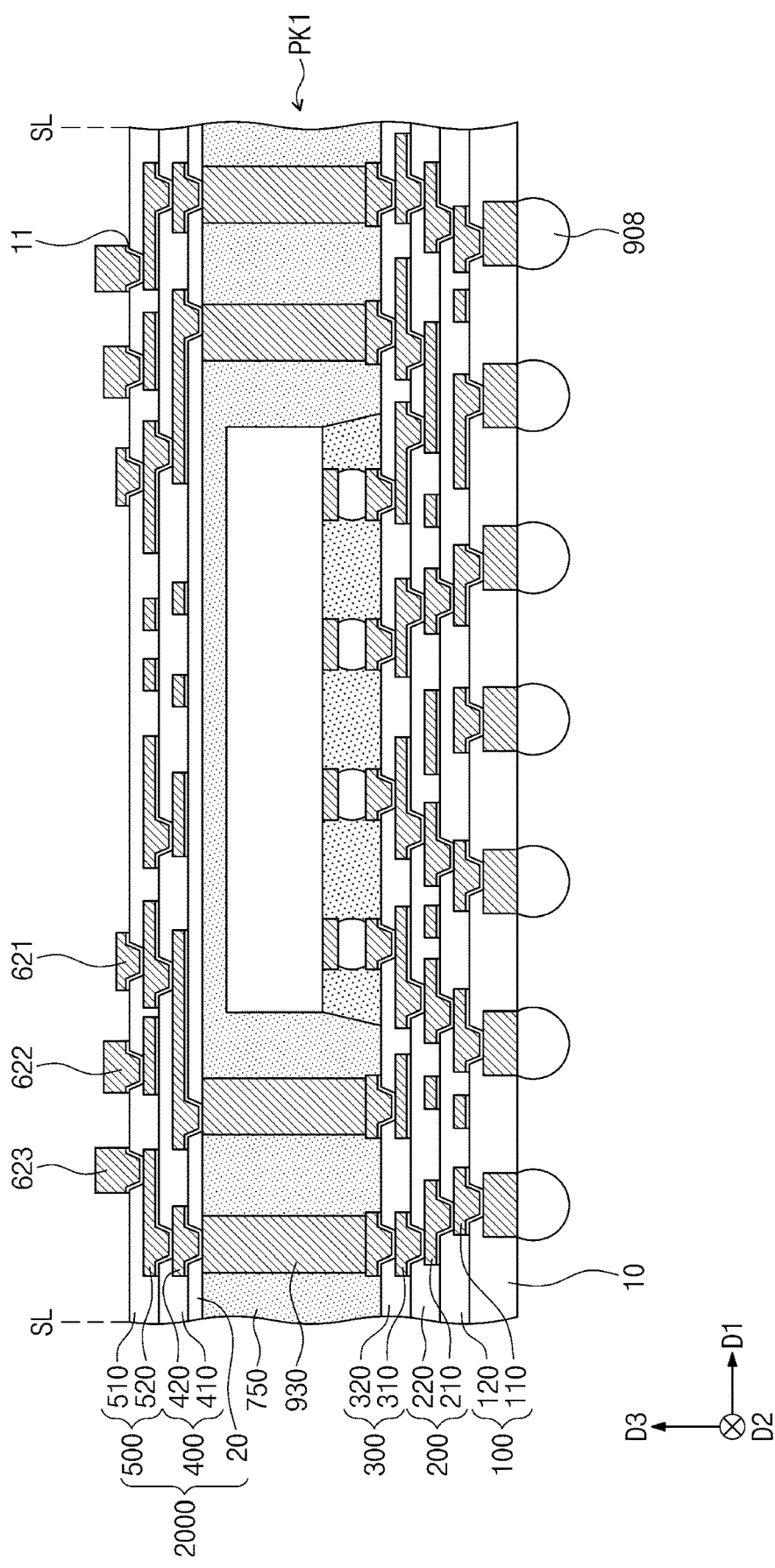

Referring to FIG. 4K, the carrier substrate CR, the adhesive layer AD, and the first seed layer 11a may be removed. An etching process may be employed to remove the first seed layer 11a. The removal of the first seed layer 11a may expose the under-bump patterns 910. External bonding terminals 908 may be formed on the exposed under-bump patterns 910. A singulation process may be executed along a dashed line SL (i.e., a scribe lane) in a direction from the lower redistribution substrate 1000 toward an upper redistribution substrate 2000. The singulation process may form a first semiconductor package PK1.

Figure 4L:
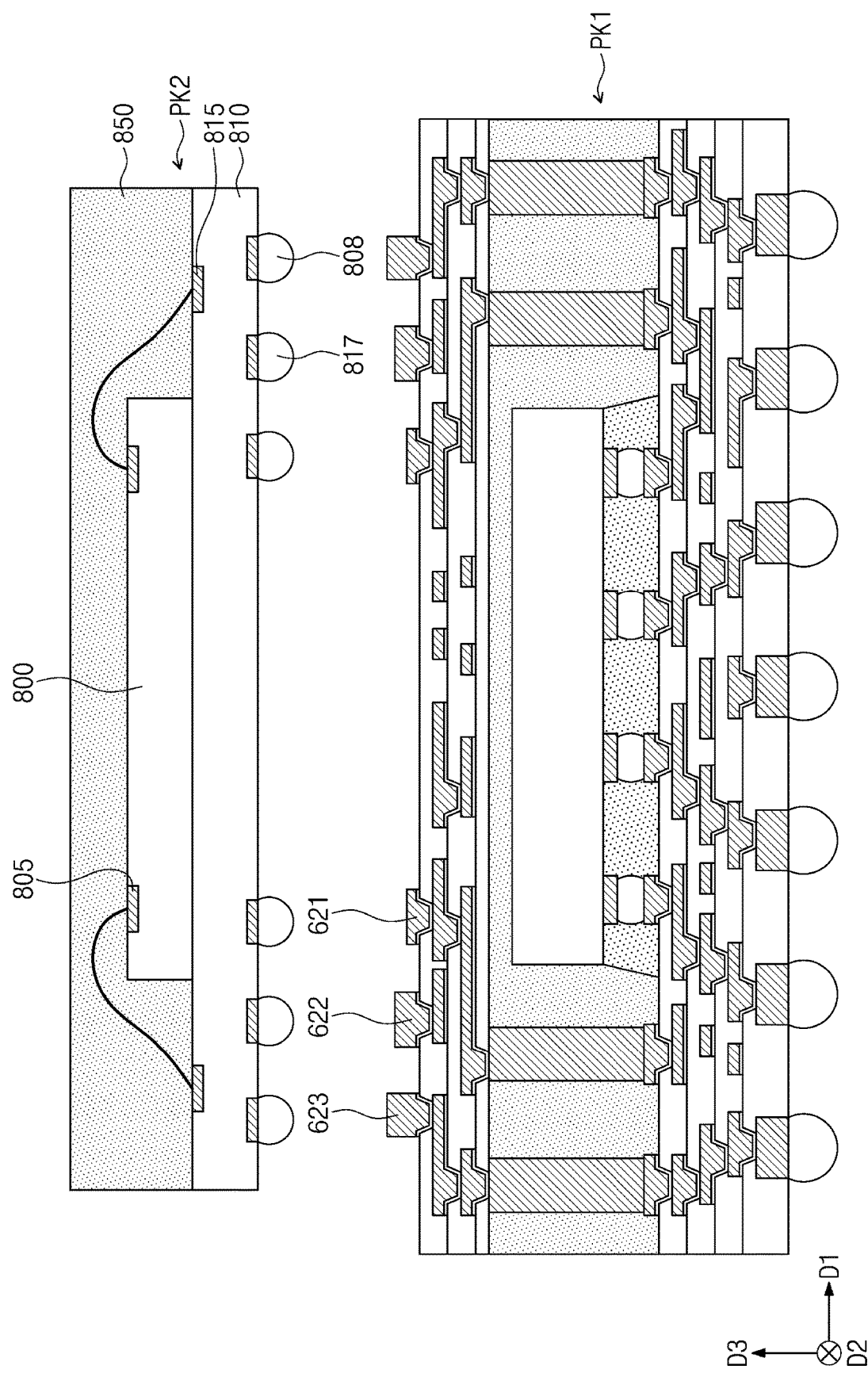

Referring to FIGS. 4L and 1B, a second semiconductor package PK2 may be attached to the first semiconductor package PK1. A thermal compression process may be employed to allow second connection terminals 808 to contact the first, second, and third upper bonding pads 621, 622, and 623.

According to the present inventive concepts, each of the first, second, and third upper bonding pads 621, 622, and 623 may have a thickness that increases in a direction from a central portion at the top surface 2000a of the upper redistribution substrate 2000 to an outer portion at a top surface 2000a of the upper redistribution substrate 2000.

The first semiconductor package PK1 may experience warpage as shown in FIG. 2A during or after the formation of the external bonding terminals 908 of FIG. 4K or during or after the attachment of the second semiconductor package PK2 of FIG. 4L. Even when the warpage occurs, because the third thickness T3 of the third upper bonding pad 623, or outer upper bonding pad, is sufficiently large, the outer upper bonding pads 623 may contact the external bonding terminals 908, and accordingly, a semiconductor package device may increase in reliability.

Figure 5:
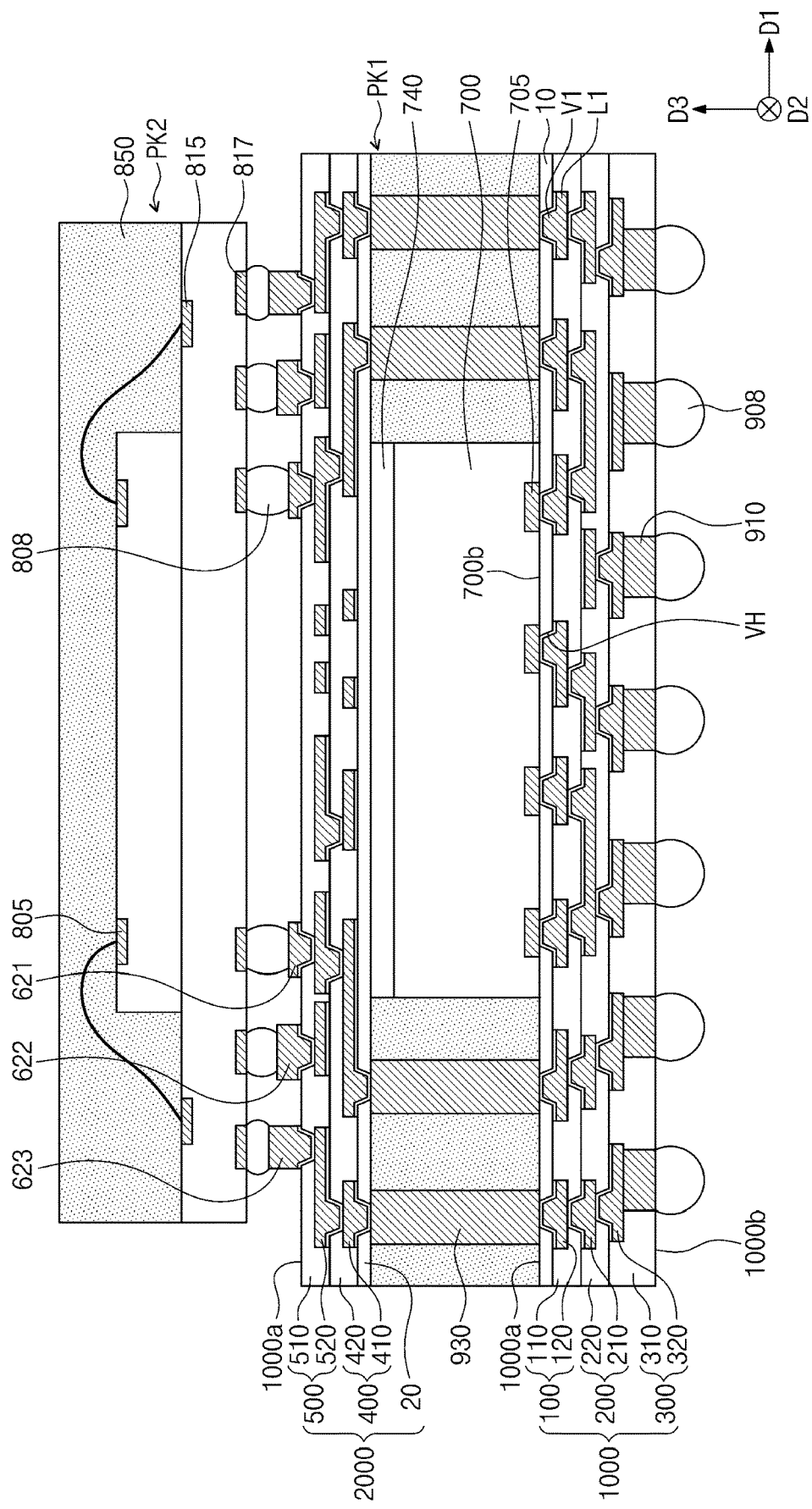
FIG. 5 illustrates a cross-sectional view showing a semiconductor package device according to some example embodiments of the present inventive concepts.

FIG. 5 illustrates a cross-sectional view showing a semiconductor package device 3 according to some example embodiments of the present inventive concepts. Omission will be made to avoid a repetitive description in connection with FIGS. 1A to 1C. The semiconductor package device 3 according to the embodiment of FIG. 5 may be a fan-out semiconductor package device formed in a chip-first process.

Referring to FIG. 5, the first semiconductor chip 700 and the lower redistribution substrate 1000 may be electrically connected to each other without the first connection terminals 708 of FIG. 1B. The lower redistribution substrate 1000 may include the first photosensitive dielectric layer 10, the first redistribution layer 100, the second redistribution layer 200, and the third redistribution layer 300 that are sequentially stacked on one surface 700b of the first semiconductor chip 700.

An adhesive film 740 may be interposed between the first semiconductor chip 700 and the upper redistribution substrate 2000. The adhesive film 740 may be, for example, a die attach film (DAF).

The first redistribution patterns 110 may be uppermost ones of the first, second, and third redistribution patterns 110, 210, and 310. The first redistribution patterns 110 may be redistribution patterns most adjacent to the first surface 1000a of the lower redistribution substrate 1000.

The third redistribution patterns 310 may be lowermost ones of the first, second, and third redistribution patterns 110, 210, and 310. The third redistribution patterns 310 may be redistribution patterns most adjacent to the second surface 1000b of the lower redistribution substrate 1000.

The first photosensitive dielectric layer 10 may include the via holes VH that expose the first chip pads 705 and lower portions of the conductive pillars 930. The first redistribution patterns 110 may be provided on the first photosensitive dielectric layer 10, while filling the via holes VH. Some of the via parts V1 of the first redistribution patterns 110 may contact the first chip pads 705, and remaining ones of the via parts V1 of the first redistribution patterns 110 may contact the lower portions of the conductive pillars 930. The under-bump patterns 910 may be provided on the line parts L1 of the third redistribution patterns 310.

A relationship between the diameters W1 to W3 and the thicknesses T1 to T3 of the first, second, and third upper bonding pads 621, 622, and 623 may be the same as that discussed in FIG. 1B.

Figure 6:
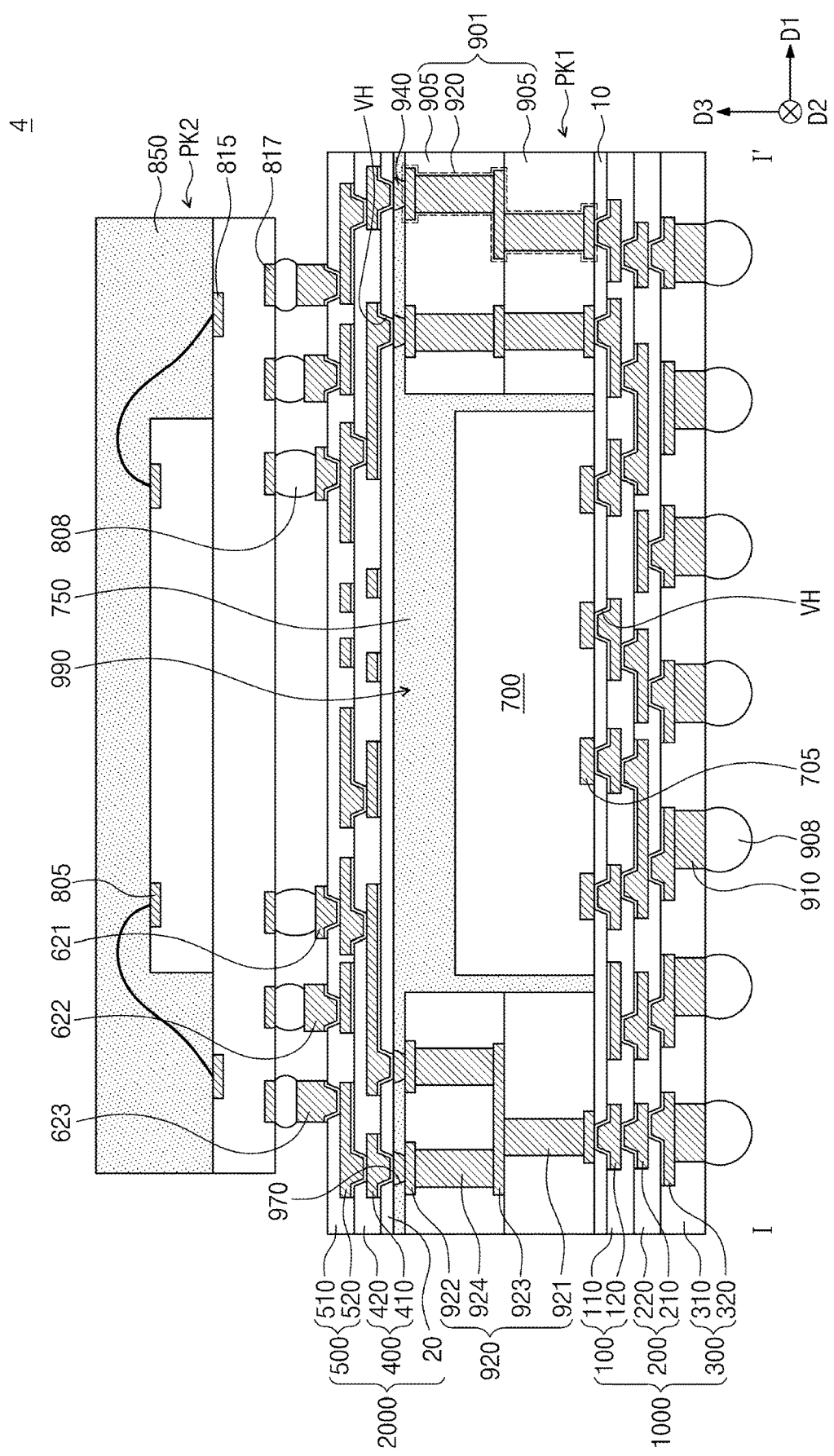
FIG. 6 illustrates a cross-sectional view showing a semiconductor package device according to some example embodiments of the present inventive concepts.

FIG. 6 illustrates a cross-sectional view showing a semiconductor package device 4 according to some example embodiments of the present inventive concepts. Omission will be made to avoid a repetitive description in connection with FIGS. 1A to 1C. The semiconductor package device 4 may be a fan-out semiconductor package device formed in a chip-first process.

Referring to FIG. 6, the semiconductor package device 4 according to some example embodiments may include the first semiconductor package PK1 including a connection substrate 901. The connection substrate 901 may have a hole 990 that penetrates therethrough. The hole 990 may be positioned on a central portion of the lower redistribution substrate 1000. The first semiconductor chip 700 may be provided in the hole 990. The connection substrate 901 may be provided on the lower redistribution substrate 1000. For example, the connection substrate 901 may be fabricated by forming the hole 990 in a printed circuit board. The connection substrate 901 may include base layers 905 and conductive structures 920.

The base layers 905 may include a dielectric material. In some example embodiments, each of the base layers 905 may include a carbon-based material, a ceramic, or a polymer. For example, each of the base layers 905 may include a polymer impregnated with glass fiber.

The hole 990 may penetrate the base layers 905. The conductive structure 920 may include a first pad 921, a conductive line 923, vias 924, and a second pad 922.

The first pad 921 may be provided on a bottom surface of the connection substrate 901. The conductive line 923 may be interposed between the base layers 905. The vias 924 may penetrate the base layers 905 and may be coupled to the conductive line 923. The second pad 922 may be disposed on a top surface of the connection substrate 901 and may be coupled to one of the vias 924. The second pad 922 may be electrically connected to the first pad 921 through the vias 924 and the conductive line 923.

The second pad 922 may not be vertically aligned with the first pad 921. The number or arrangement of the second pad 922 may be different from the number or arrangement of the first pad 921. The conductive structure 920 may include metal. The conductive structure 920 may include, for example, one or more of copper, aluminum, gold, lead, stainless steels, iron, and any alloy thereof.

The first molding member 750 may fill a gap between the first semiconductor chip 700 and the connection substrate 901. The first molding member 750 may be provided therein with an upper hole 970 that exposes the second pad 922 of the conductive structure 920. According to some example embodiments, the upper hole 970 may be provided therein with a conductor 940 that fills the upper hole 970. The conductor 940 may include, for example, metal.

The lower redistribution substrate 1000 may be provided on a bottom surface of the first molding member 750. The lower redistribution substrate 1000 may include the first photosensitive dielectric layer 10, which first photosensitive dielectric layer 10 may include the via holes VH that expose the first chip pads 705 and the first pads 921 of the conductive structures 920. The first redistribution pattern 110 may be provided on the first photosensitive dielectric layer 10, while filling the via hole VH.

The upper redistribution substrate 2000 may be provided on a top surface of the first molding member 750. The upper redistribution substrate 2000 may include the second photosensitive dielectric layer 20, which second photosensitive dielectric layer 20 may include the via holes VH that expose the conductors 940. The fourth redistribution pattern 410 may be provided on the second photosensitive dielectric layer 20, while filling the via hole VH. The fourth redistribution pattern 410 may contact the conductor 940.

A relationship between the diameters W1 to W3 and the thicknesses T1 to T3 of the first, second, and third upper bonding pads 621, 622, and 623 may be the same as that discussed in FIG. 1B.

A semiconductor package device according to the present inventive concepts may have a package-on-package structure that includes a lower package, an upper package on the lower package, and connection terminals between the lower and upper packages. The lower package may have a redistribution substrate at its upper portion, and bonding pads may be provided on the redistribution substrate. As the bonding pads have their thicknesses that increase in a direction from a central portion at the top surface of the redistribution substrate to an outer portion at a top surface of the redistribution substrate, even when warpage occurs at the lower package and/or the upper package, the bonding pads and the connection terminals may contact each other to allow the semiconductor package device to have increased reliability.

The aforementioned description provides some example embodiments for explaining the present inventive concepts. Therefore, the present inventive concepts are not limited to the embodiments described above, and it will be understood by one of ordinary skill in the art that variations in form and detail may be made therein without departing from the spirit and essential features of the present inventive concepts.

What is claimed is:

1. A semiconductor package device, comprising:
a first semiconductor package;
a second semiconductor package on the first semiconductor package; and
a plurality of first connection terminals between the first semiconductor package and the second semiconductor package,
wherein the first semiconductor package includes:
a lower redistribution substrate;
a semiconductor chip on the lower redistribution substrate; and
an upper redistribution substrate vertically spaced apart from the lower redistribution substrate, wherein the semiconductor chip is disposed between the lower redistribution substrate and the upper redistribution substrate,
wherein the upper redistribution substrate includes:
a dielectric layer;
a plurality of redistribution patterns which are vertically stacked in the dielectric layer and each of which includes a line part and a via part; and
a plurality of bonding pads on uppermost ones of the plurality of redistribution patterns,
wherein the plurality of bonding pads are exposed from the dielectric layer and are in contact with the first connection terminals,
wherein, when viewed in a plan view, the plurality of bonding pads are sized in decreasing diameters in a first direction from a central portion of a top surface of the upper redistribution substrate to an outer portion of the top surface of the upper redistribution substrate, and
wherein, when viewed in a cross-sectional view, the plurality of bonding pads are sized in increasing thicknesses in the first direction.

2. The semiconductor package device of claim 1,
wherein the dielectric layer includes at least one selected from polyimide, polybenzoxazole, phenolic polymers, and benzocyclobutene polymers.

3. The semiconductor package device of claim 1,
wherein the bonding pads include:
a plurality of inner bonding pads adjacent to the central portion at the top surface of the upper redistribution substrate; and
a plurality of outer bonding pads adjacent to the outer portion at the top surface of the upper redistribution substrate,
wherein the plurality of outer bonding pads surround the plurality of inner bonding pads, and
wherein a diameter of each of the plurality of inner bonding pads is greater than about 1 times and less than about 2 times a diameter of each of the plurality of outer bonding pads.

4. The semiconductor package device of claim 3,
wherein a thickness of each of the plurality of outer bonding pads is greater than about 1 times and less than about 2 times a thickness of each of the plurality of inner bonding pads, the thicknesses of the plurality of outer and inner bonding pads being measured from a top surface of the dielectric layer.

5. The semiconductor package device of claim 3,
wherein each of the plurality of inner and outer bonding pads includes a first metal pattern and a second metal pattern that are sequentially stacked,
wherein the first metal pattern includes copper, and
wherein the second metal pattern includes nickel and gold.

6. The semiconductor package device of claim 5,
wherein a thickness of the first metal pattern included in each of the plurality of inner bonding pads is less than a thickness of the first metal pattern included in each of the plurality of outer bonding pads, and
wherein a thickness of the second metal pattern included in each of the plurality of inner bonding pads is less than a thickness of the second metal pattern included in each of the plurality of outer bonding pads.

7. The semiconductor package device of claim 3,
wherein the diameter of each of the inner bonding pads has a value from about 180 μm to about 240 μm, and
wherein the diameter of each of the outer bonding pads has a value from about 100 μm to about 160 μm.

8. The semiconductor package device of claim 3,
wherein the thickness of each of the plurality of inner bonding pads has a value from about 2 μm to about 6 μm, and
wherein the thickness of each of the outer bonding pads has a value from about 7 μm to about 10 μm.

9. The semiconductor package device of claim 1,
wherein a spacing distance between the top surface of the upper redistribution substrate and a bottom surface of the second semiconductor package increases in the first direction.

10. The semiconductor package device of claim 1,
wherein a level of the central portion at the top surface of the upper redistribution substrate is higher than a level of the outer portion at the top surface of the upper redistribution substrate.

11. The semiconductor package device of claim 1, further comprising:
an under-fill layer between the upper redistribution substrate and the second semiconductor package,
wherein the under-fill layer covers a lateral surface of each of the plurality of first connection terminals, and top and lateral surfaces of each of the plurality of bonding pads.

12. The semiconductor package device of claim 1, further comprising:
a plurality of second connection terminals between the lower redistribution substrate and the semiconductor chip; and an under-fill layer that covers a top surface of the lower redistribution substrate, a bottom surface of the semiconductor chip, and a lateral surface of each of the second connection terminals.

13. A semiconductor package device, comprising:
a first semiconductor package;
a second semiconductor package on the first semiconductor package; and
a plurality of connection terminals between the first semiconductor package and the second semiconductor package,
wherein the first semiconductor package includes:
a lower redistribution substrate;
a first semiconductor chip on the lower redistribution substrate; and
an upper redistribution substrate vertically spaced apart from the lower redistribution substrate, wherein the first semiconductor chip is disposed between the lower redistribution substrate and the upper redistribution substrate,
wherein the upper redistribution substrate includes:
a dielectric layer;
a plurality of redistribution patterns which are vertically stacked in the dielectric layer and each of which includes a line part and a via part; and
a plurality of bonding pads on uppermost ones of the plurality of redistribution patterns,
wherein the plurality of bonding pads are exposed from the dielectric layer and are in contact with the plurality of connection terminals,
wherein a top surface of the upper redistribution substrate is curved down, and a bottom surface of the second semiconductor package is curved up,
wherein a spacing between the top surface of the upper redistribution substrate and the bottom surface of the second semiconductor package increases in a first direction from a central portion of the top surface of the upper redistribution substrate to an outer portion of the top surface of the upper redistribution substrate, and
wherein a level difference between a bottom surface of a first bonding pad, among the plurality of bonding pads, on the outer portion of the top surface of the upper redistribution substrate and a bottom surface of a second bonding pad, among the plurality of bonding pads, on the central portion of the top surface of the upper redistribution substrate is greater than a level difference between a top surface of the first bonding pad and a top surface of the second bonding pad.

14. The semiconductor package device of claim 13, wherein a level of the central portion at the top surface of the upper redistribution substrate is higher than a level of the outer portion at the top surface of the upper redistribution substrate.

15. The semiconductor package device of claim 13, wherein the second semiconductor package includes:
a package substrate; and
a second semiconductor chip on the package substrate,
wherein a level of a central portion at a bottom surface of the package substrate is lower than a level of an outer portion at the bottom surface of the package substrate.

16. A semiconductor package device, comprising:
a first semiconductor package;
a second semiconductor package on the first semiconductor package; and
a plurality of first connection terminals between the first semiconductor package and the second semiconductor package,
wherein the first semiconductor package includes:
a lower redistribution substrate;
a semiconductor chip on the lower redistribution substrate;
a plurality of second connection terminals between the lower redistribution substrate and the semiconductor chip;
a plurality of conductive pillars on the lower redistribution substrate and spaced apart from a lateral surface of the semiconductor chip;
an under-fill layer that covers the plurality of second connection terminals; and
an upper redistribution substrate vertically spaced apart from the lower redistribution substrate, wherein the semiconductor chip is disposed between the lower redistribution substrate and the upper redistribution substrate,
wherein the upper redistribution substrate includes:
a dielectric layer;
a plurality of redistribution patterns which are vertically stacked in the dielectric layer and each of which includes a line part and a via part; and
a plurality of bonding pads on uppermost ones of the plurality of redistribution patterns,
wherein the plurality of bonding pads are exposed from the dielectric layer and are in contact with the plurality of first connection terminals,
wherein, when viewed in a plan view, the plurality of bonding pads are sized in decreasing diameters in a first direction from a central portion of a top surface of the upper redistribution substrate to an outer portion of the top surface of the upper redistribution substrate, and
wherein, when viewed in a cross-sectional view, the plurality of bonding pads are sized in increasing thicknesses in the first direction.

17. The semiconductor package device of claim 16, wherein a level difference between a bottom surface of a first bonding pad, among the plurality of bonding pads, on the outer portion at the top surface of the upper redistribution substrate and a bottom surface of a second bonding pad, among the plurality of bonding pads, on the central portion at the top surface of the upper redistribution substrate is greater than a level difference between a top surface of the first bonding pad and a top surface of the second bonding pad.

18. The semiconductor package device of claim 16, wherein the plurality of bonding pads include:
a plurality of inner bonding pads adjacent to the central portion at the top surface of the upper redistribution substrate and arranged in a shape of a first rectangle; and
a plurality of outer bonding pads adjacent to the outer portion at the top surface of the upper redistribution substrate and arranged in a shape of a second rectangle, and
wherein the plurality of outer bonding pads arranged in the shape of the second rectangle surround the inner bonding pads arranged in the shape of the first rectangle.

19. The semiconductor package device of claim 18, wherein a diameter of each of the plurality of inner bonding pads is greater than about 1 times and less than about 2 times a diameter of each of the plurality of outer bonding pads, and wherein a thickness of each of the plurality of outer bonding pads is greater than about 1 times and less than about 2 times a thickness of each of the plurality of inner bonding pads.

20. The semiconductor package device of claim 18,
wherein the diameter of each of the plurality of inner bonding pads has a value from about 180 μm to about 240 μm,
wherein the diameter of each of the plurality of outer bonding pads has a value from about 100 μm to about 160 μm,
wherein the thickness of each of the plurality of inner bonding pads has a value from about 2 μm to about 6 μm, and
wherein the thickness of each of the plurality of outer bonding pads has a value from about 7 μm to about 10 μm.

* * * * *